(12) United States Patent
McCann

(10) Patent No.: US 10,546,965 B2
(45) Date of Patent: Jan. 28, 2020

(54) THERMOPHOTOVOLTAIC MATERIALS, METHODS OF DEPOSITION, AND DEVICES

(71) Applicant: The Board of Regents of the University of Oklahoma, Norman, OK (US)

(72) Inventor: Patrick John McCann, Norman, OK (US)

(73) Assignee: The Board of Regents of the University of Oklahoma, Norman, OK (US)

(*) Notice: Subject to any disclaimer, the term of this patent is extended or adjusted under 35 U.S.C. 154(b) by 0 days.

(21) Appl. No.: 15/101,327

(22) PCT Filed: Dec. 2, 2014

(86) PCT No.: PCT/US2014/068099
§ 371 (c)(1),
(2) Date: Jun. 2, 2016

(87) PCT Pub. No.: WO2015/084810
PCT Pub. Date: Jun. 11, 2015

(65) Prior Publication Data
US 2016/0315578 A1    Oct. 27, 2016

Related U.S. Application Data

(60) Provisional application No. 61/912,181, filed on Dec. 5, 2013.

(51) Int. Cl.
*H02S 10/30* (2014.01)
*H01L 31/032* (2006.01)
(Continued)

(52) U.S. Cl.
CPC .... *H01L 31/0324* (2013.01); *H01L 31/02168* (2013.01); *H01L 31/0687* (2013.01); *H01L 31/18* (2013.01); *H02S 10/30* (2014.12)

(58) Field of Classification Search
CPC .... H02S 10/30; H01L 31/324; H01L 31/1037
See application file for complete search history.

(56) References Cited

U.S. PATENT DOCUMENTS 4,157,926 A  *  6/1979  Schoolar ............. H01L 31/0324
                                                        250/214 SG
4,312,114 A       1/1982  Schoolar
(Continued)

FOREIGN PATENT DOCUMENTS

WO      2009074993 A2      6/2009
WO      2011146843 A2     11/2011
WO   WO-2012018649 A2  *   2/2012  ....... H01L 31/02168

OTHER PUBLICATIONS

Optical properties of PbTe and PbSeChinedu E. Ekuma, David J. Singh, J. Moreno, and M. JarrellPhys. Rev. B 85, 085205—Published Feb. 13, 2012 (Year: 2012).*

(Continued)

*Primary Examiner* — Edward J. Schmiedel
(74) *Attorney, Agent, or Firm* — McAfee & Taft, A Professional Corporation

(57) ABSTRACT

Novel materials, material deposition methods, and devices used to generate electrical power from thermal radiators based on thermophotovoltaic (TPV) operating principles using group IV-VI alloys and materials are disclosed. A semiconductor structure comprising (N) stacked junctions, each junction formed of a IV-VI semiconductor alloy and each of said N junctions having a bandgap, where N is an integer and N>1 is disclosed. The semiconductor structure is configured to capture electromagnetic radiation having wavelengths from about 1 μm to about 7 μm. TPV devices comprising the novel semiconductor structure and methods of making the novel structures and devices are also disclosed.

7 Claims, 10 Drawing Sheets

(51) Int. Cl.
*H01L 31/0687* (2012.01)
*H01L 31/0216* (2014.01)
*H01L 31/18* (2006.01)

(56) References Cited

U.S. PATENT DOCUMENTS

| | | | |
|---|---|---|---|
| 5,753,050 | A | 5/1998 | Charache et al. |
| 5,776,794 | A | 7/1998 | McCann |
| 5,932,964 | A | 8/1999 | McCann et al. |
| 6,693,340 | B1 | 2/2004 | Amaratunga et al. |
| 8,288,797 | B2 | 10/2012 | Cooke et al. |
| 8,350,208 | B1 | 1/2013 | Zhang et al. |
| 8,460,996 | B2 | 6/2013 | Karve et al. |
| 8,476,140 | B2 | 7/2013 | Sandhu et al. |
| 8,513,518 | B2 | 8/2013 | McGlynn et al. |
| 8,563,844 | B2 * | 10/2013 | Gray ............... H01L 29/26 136/200 |
| 8,901,612 | B2 * | 12/2014 | Gray ............... H01L 29/26 257/11 |
| 2004/0065363 | A1 * | 4/2004 | Fetzer ............ H01L 21/02381 136/262 |
| 2004/0208219 | A1 | 10/2004 | McCann et al. |
| 2006/0107995 | A1 | 5/2006 | Kovacik et al. |
| 2009/0255580 | A1 * | 10/2009 | Dasgupta ............ B82Y 20/00 136/256 |
| 2010/0116333 | A1 * | 5/2010 | Ponce ............ H01L 31/035227 136/256 |
| 2010/0301454 | A1 | 12/2010 | Zhang et al. |
| 2011/0079709 | A1 * | 4/2011 | Campbell ......... H01L 27/14627 250/214 R |
| 2011/0155207 | A1 | 6/2011 | Singh |
| 2012/0031486 | A1 * | 2/2012 | Parce ............ H01L 31/02168 136/256 |
| 2012/0055528 | A1 | 3/2012 | McCann |
| 2012/0211071 | A1 | 8/2012 | Newman et al. |
| 2012/0216848 | A1 * | 8/2012 | Gray ............... H01L 29/155 136/238 |
| 2012/0217548 | A1 * | 8/2012 | Gray ............... H01L 29/155 257/200 |
| 2012/0227798 | A1 | 9/2012 | Pan et al. |
| 2013/0009132 | A1 * | 1/2013 | McCann ............ H01L 35/16 257/15 |
| 2013/0133730 | A1 | 5/2013 | Pan et al. |
| 2013/0175662 | A1 | 7/2013 | Sinha et al. |
| 2013/0206219 | A1 * | 8/2013 | Kurtin ............ H01L 31/02168 136/255 |

OTHER PUBLICATIONS

Shen, W.Z. et al.; Band gaps, effective masses and refractive indices of PbSrSe thin films: Key properties for mid-infrared optoelectronic device applications; Journal of Applied Physics 91, 192 (2002); doi: 10.1063/1.1421634 (Year: 2002).*
R. R. Siergiej, B. Wernsman, S. A. Derry, R. G. Mahorter, R. J. Wehrer, S. D. Link, M. N. Palmisiano, R. L. Messham, S. Murray, C. S. Murray, F. Newman, J. Hills, and D. Taylor, "20% Efficient InGaAs/InPAs Thermophotovoltaic Cells", AIP Conf. Proc. 653, 414 (2003).
David M. Wilt, Christopher S. Murray, Navid S. Fatemi, and Victor Weizer, "n/p/n tunnel junction InGaAs Monolithic Interconnected Module (MIM)", AIP Conf. Proc. 460, 152 (1999).
M. W. Wanlass, J. J. Carapella, A. Duda, K. Emery, L. Gedvilas, T. Moriarty, S. Ward, J. D. Webb, X. Wu, and C. S. Murray, "High-performance, 0.6-eV, Ga0.32In0.68As/InAs0.32P0.68 thermophotovoltaic converters and monolithically interconnected modules", AIP Conf. Proc. 460, 132 (1999).
Richard R. Siergiej, Samar Sinharoy, Thomas Valko, Rebecca J. Wehrer, Bernard Wernsman, Samuel D. Link, Robert W. Schultz, and Rowan. L. Messham, "InGaAsP/InGaAs Tandem TPV Device", AIP Conf. Proc. 738, 480 (2004).
Jian Yin and Roberto Paiella, "Limiting performance analysis of cascaded interband/intersubband thermophotovoltaic devices", Appl. Phys. Lett. 98, 041103 (2011).
P. J. McCann, L. Li, J. Furneaux, and R. Wright, "Optical Properties of Ternary and Quaternary IV-VI Semiconductor Layers on (100) BaF2 Substrates", Applied Physics Letters 66, 1355 (1995).
H. K. Sachar, I. Chao, P. J. McCann, and X. M. Fang, "Growth and Characterization of PbSe and Pb1-xSnxSe on Si (100)", Journal of Applied Physics 85, 7398 (1999).
X. M. Fang, K. Namjou, I. Chao, P. J. McCann, N. Dai, and G. Tor, "Molecular Beam Epitaxy of PbSrSe and PbSe/PbSrSe Multiple Quantum Well Structures for use in Mid-Infrared Light Emitting Devices", Journal of Vacuum Science and Technology B 18, 1720 (2000).
C. H. Henry, "Limiting efficiencies of ideal single and multiple energy gap terrestrial solar cells", J. Appl. Phys. 51, 4494 (1980).
X. M. Fang, I-Na Chao, B. N. Strecker, P. J. McCann, S. Yuan, W. K. Liu, and M. B. Santos, "Molecular Beam Epitaxial Growth of Bi2Se3- and Tl2Se-Doped PbSe and PbEuSe on CaF2/Si(111)", Journal of Vacuum Science and Technology B 16, 1459 (1998).
P. J. McCann, S. Aanegola, and J. E. Furneaux, "Growth and Characterization of Thallium and Gold Doped PbSe0.78Te0.22 Layers Lattice Matched with BaF2 Substrates", Applied Physics Letters 65, 2185 (1994).
P. J. McCann, X. M. Fang, W. K. Liu, B. N Strecker, and M. B. Santos, "MBE Growth of PbSe/CaF2/Si(111) Heterostructures", Journal of Crystal Growth 175/176, 1057 (1997).
E. S. Hellman, P. M. Pitner, A. Harwit, D. Liu, G. W. Yoffe, J. S. Harris, Jr., B. Caffee, and T. Hierl, "Molecular beam epitaxy of gallium arsenide using direct radiative substrate heating", J. Vac. Sci. Technol. B 4, 574 (1986).
Joerg Isenberg and Wilhelm Warta, "Free carrier absorption in heavily doped silicon layers", Appl. Phys. Lett. 84, 2265 (2004).
P. Müller, H. Zogg, A. Fach, J. John, C. Paglino, A. N. Tiwari, M. Krejci, and G. Kostorz, "Reduction of Threading Dislocation Densities in Heavy Lattice Mismatched PbSe on Si(111) by Glide," Phys. Rev. Lett. 78, 3007 (1997).
B. N. Strecker, P. J. McCann, X. M. Fang, R. J. Hauenstein, M. O'Steen, and M. B. Johnson, "LPE Growth of Crack-Free PbSe Layers on (100)-Oriented Silicon Using MBE-Grown PbSe/BaF2/CaF2 Buffer Layers", Journal of Electronic Materials 26, 4-44 (1997).
X. M. Fang, H. Z. Wu, N. Dai, Z. Shi, and P. J. McCann, "Molecular Beam Epitaxy of Periodic BaF2/PbEuSe Layers on Si(111)", Journal of Vacuum Science and Technology B 17, 1297 (1999).
P. J. McCann, I. Chao, H. Sachar, D. McAlister, C. P. Li, X. M. Fang, H. Wu, and K. Namjou, "IV-VI Semiconductor Growth on Silicon Substrates and New Mid-Infrared Laser Fabrication Methods" Spectrochimica Acta Part A: Molecular and Biomolecular Spectroscopy 55, (1999).
C. P. Li, P. J. McCann, and X. M. Fang, "Strain Relaxation in PbSnSe and PbSe/PbSnSe Layers Grown by Liquid Phase Epitaxy on (100)-Oriented Silicon", Journal of Crystal Growth 208, 423 (2000).
G. Xu, X. M. Fang, P. J. McCann and Z. Shi, MBE Growth of Wide Band Gap Pb1-xSrxSe on Si(111) Substrate, Journal of Crystal Growth 209, 763 (2000).
D. W. McAlister, P. J. McCann, K. Namjou, H. Z. Wu and X. M. Fang, "Mid-IR Photoluminescence from IV-VI Layers Grown on Silicon", Journal of Applied Physics 89, 3514 (2001).
H. Z. Wu, P. J. McCann, O. Alkhouli, X. M. Fang, D. McAlister, K. Namjou, N. Dai, S. J. Chung, and P. H. O. Rappl, "Molecular beam epitaxial growth of IV-VI multiple quantum well structures on Si(111) and BaF2(111) and optical studies of epilayer heating", Journal of Vacuum Science and Technology B 19, 1447 (2001).
J. S. Jin, H. Z. Wu, Y. Chang, X, Shou, X. M. Fang, P. J. McCann, "Photoelectric properties of PbSe/BaF2/CaF2 films on Si(111)(abstract)", Journal of Infrared and Millimeter Waves 20, 154 (2001).
H. Z Wu, X. M. Fang, D. McAlister, R. Salas, Jr., and P. J. McCann, "Molecular Beam Epitaxy Growth of PbSe on BaF2-Coated Si(111) and Observation of the PbSe Growth Interface", Journal of Vacuum Science and Technology B 17, 1263 (1999).

(56) References Cited

OTHER PUBLICATIONS

H. Z. Wu, X. M. Fang, R. Salas, D. McAlister, and P. J. McCann, "Transfer of PbSe/PbEuSe Epilayers Grown by MBE on BaF2-Coated Si(111)", Thin Solid Films 352, 277 (1999).

D. W. McAlister, P. J. McCann, H. Z. Wu and X. M. Fang, "Fabrication of Thin Film Cleaved Cavities Using a Bonding and Cleaving Fixture", IEEE Photonics Technology Letters 12, 22 (2000).

P. H. O. Rappl and P. J. McCann, "Development of a Novel Epitaxial Layer Segmentation Method for Optoelectronic Device Fabrication", IEEE Photonics Technology Letters 15, 374 (2003).

Y. F. Li, P. J. McCann, A. Sow, C. Yao, and P. C. Kamat, "Improvement of Heat Dissipation Through Transfer of IV-VI Epilayers From Silicon to Copper", IEEE Photonics Technology Letters 16, 2433 (2004).

Y. F. Li, A. Sow, C. Yao and P. J. McCann, "Transfer of IV-VI Multiple Quantum Well Structures Grown by Molecular Beam Epitaxy from Si Substrates to Copper", Thin Solid Films 488, 178 (2005).

P. J. McCann and C. G. Fonstad, "Growth of $PbSe_{0.78}Te_{0.22}$ Lattice Matched with $BaF_2$", Thin Solid Films 227, 185 (1993).

P. J. McCann and D. Zhong, "Liquid Phase Epitaxy Growth of $Pb_{1-x}Sn_xSe_{1-y}Te_y$ Alloys Lattice Matched with $BaF_2$", Journal of Applied Physics 75, 1145 (1994).

International Preliminary Report on Patentability in PCT/US2014/68099 dated Jun. 6, 2016 (The Board of Regents of the University of Oklahoma).

Written Opinion of the International Searching Authority in PCT/US2014/68099 dated Mar. 11, 2015 (The Board of Regents of the University of Oklahoma).

International Search Report in PCT/US2014/68099 dated Mar. 11, 2015 (The Board of Regents of the University of Oklahoma).

Jeffers, J. et al. "Cross-plane thermal conductivity of a PbSnSe/PbSe Superlattice material", Applied Physics Letters 99, 041903-1-3 (2011).

McCann, Patrick J.; OCAST grant proposal "High Efficiency Thermophotovoltaics", Dec. 6, 2012. 16 pages.

* cited by examiner

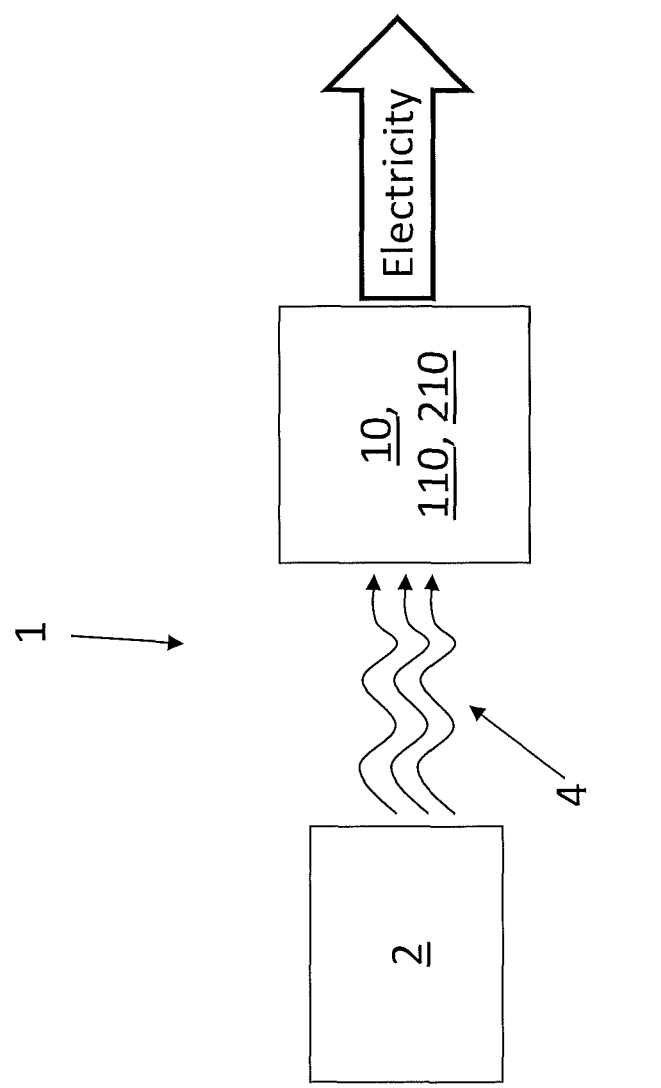

THERMOPHOTOVOLTAIC MATERIALS, METHODS OF DEPOSITION, AND DEVICES

CROSS-REFERENCE TO RELATED APPLICATION

This application is a national phase entry of PCT Application No. PCT/US2014/068099 entitled THERMOPHOTOVOLTAIC MATERIALS, METHODS OF DEPOSITION, AND DEVICES filed Dec. 2, 2014, which claims the benefit of priority to U.S. Provisional Application No. 61/912,181 filed Dec. 5, 2013, the entirety of the disclosures of which are each incorporated herein by reference.

BACKGROUND

Thermophotovoltaic (TPV) devices for electrical power generation from thermal electromagnetic radiation (EMR) emitters are currently fabricated using III-V semiconductor materials. For example, an InGaAs layer grown on an InP substrate and illuminated with a SiC radiator heated to 1058 degrees Celsius (° C.) has a power generation density of 0.9 Watt/square centimeter (W/cm$^2$) corresponding to a heat-to-electricity conversion efficiency of 5.1%.

In addition, these types of III-V semiconductor devices can only capture infrared radiation having wavelengths up to about 2.20 micrometers (μm) at or above room temperature. It is predicted that TPV devices utilizing III-V semiconductor structures can generate electrical power densities of 2.8 W/cm$^2$ with a 1300 Kelvin (K) thermal EMR emitters which represents a radiated-heat-to-electricity conversion efficiency of 17.3%.

Additionally, current electrical generation systems using III-V TPV devices are susceptible to losses in efficiencies due to cell heating, require spectral filtering or other concentration devices, and are expensive to manufacture.

SUMMARY

A semiconductor structure having a top end and a bottom end, the semiconductor structure comprising (N) stacked junctions, each junction formed of a semiconductor alloy and each of said N junctions having a bandgap, where N is an integer and N≥1, and wherein said semiconductor structure is configured to capture electromagnetic radiation having wavelengths from about 1 μm to about 7 μm.

A thermophotovoltaic (TPV) device configured to absorb electromagnetic radiation and convert said absorbed radiation into electricity, the device comprising a semiconductor structure configured to absorb electromagnetic radiation having wavelengths from about 1 μm to about 7 μm.

A multi junction thermophotovoltaic (TPV) device comprising a IV-VI semiconductor structure formed from at least two junctions. The at least two junctions including a first junction having a first bandgap, a second junction proximate to said first junction, said second junction having a second bandgap less than said first bandgap, wherein said first and second junctions are compositionally different, and a first tunnel junction between said first and second junctions and electrically connecting said first and second junctions in series. The multi-junction TPV device also includes at least one connector proximate to said IV-VI semiconductor structure and configured to operably couple said multi-junction TPV device with a load.

An energy conversion system comprising an emitter configured to emit electromagnetic radiation where a portion of said emitted electromagnetic radiation is in the infrared wavelength range. The energy conversion system also includes a TPV device, wherein said TPV device is configured to absorb said emitted infrared wavelength electromagnetic radiation and convert said absorbed infrared wavelength electromagnetic radiation into electricity.

A method of making a semiconductor structure is disclosed. The method comprising the steps of forming a first semiconductor junction having a first thickness on a growth substrate, wherein the first semiconductor junction is formed of a semiconductor alloy having the formulation of $Pb_{1-x \text{ or } 1-z}(A_x(B_z)Y$, with $0.0 \leq x < 0.3$, $0.0 \leq z < 0.1$ and when $x > 0.0$ then $z = 0.0$, or when $z > 0.0$ then $x = 0.0$, and A is an element selected from the group consisting of Sr and Eu; and B is an element selected from the group consisting of Sn; and Y is one or more elements chosen from Se, S, and Te.

BRIEF DESCRIPTION OF THE DRAWINGS

Several embodiments of the presently disclosed inventive concepts are hereby illustrated in the appended drawings. It is to be noted however, that the appended drawings only illustrate several typical embodiments and are therefore not intended to be considered limiting of the scope of the presently disclosed inventive concepts. Further, in the appended drawings, like or identical reference numerals may be used to identify common or similar elements and not all such elements may be so numbered. The figures are not necessarily to scale and certain features and certain views of the figures may be shown as exaggerated in scale or in schematic in the interest of clarity and conciseness.

FIG. 1 depicts an energy conversion system.

DETAILED DESCRIPTION

Figure 2A:
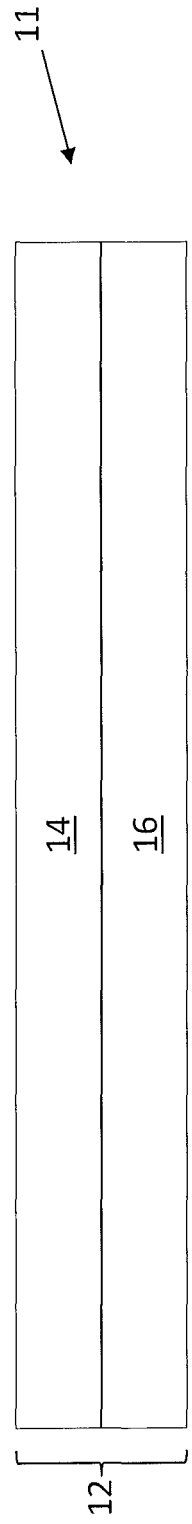
FIG. 2A shows a single junction semiconductor structure configuration.

Before further explaining at least one embodiment of the presently disclosed inventive concepts in detail by way of exemplary description, drawings, experimentation, and results, it is to be understood that the inventive concepts disclosed herein are not limited in application to the details of construction and the arrangement of the compositions, formulations, steps, or components set forth in the following description or illustrated in the drawings, examples, experiments, and/or results. The presently disclosed inventive concepts are capable of other embodiments or of being practiced or carried out in various ways. As such, the language used herein is intended to be given the broadest possible scope and meaning; and the embodiments are meant to be exemplary—not exhaustive. Also, it is to be understood that the phraseology and terminology employed herein is for the purpose of description and should not be regarded as limiting except where indicated as such.

Unless otherwise defined herein, scientific and technical terms used in connection with the presently disclosed inventive concepts shall have the meanings that are commonly understood by those of ordinary skill in the art. Further, unless otherwise required by context, singular terms shall include pluralities and plural terms shall include the singular. The nomenclatures utilized in connection with, and the laboratory procedures and techniques of, analytical chemistry, and semiconductor production described herein are those well known and commonly used in the art.

All patents, published patent applications, and non-patent publications referenced in any portion of this application are herein expressly incorporated by reference in their entirety to the same extent as if each individual patent or publication was specifically and individually indicated to be incorporated by reference.

All of the compositions, devices, and/or methods disclosed herein can be made and executed without undue experimentation in light of the present disclosure. While the compositions, devices and methods of the presently disclosed inventive concepts have been described in terms of particular examples and embodiments, it will be apparent to those of skill in the art that variations may be applied to the devices, compositions and/or methods and in the steps or in the sequence of steps of the method described herein without departing from the concept, spirit and scope of the presently disclosed inventive concepts. All such similar substitutes and modifications apparent to those skilled in the art are deemed to be within the spirit, scope and concept of the presently disclosed inventive concepts as defined by, but not limited to, the appended claims.

As utilized in accordance with the present disclosure, the following terms, unless otherwise indicated, shall be understood to have the following meanings: The use of the word "a" or "an" when used in conjunction with the term "comprising" in the claims and/or the specification may mean "one," but it is also consistent with the meaning of "one or more," "at least one," and "one or more than one." The use of the term "or" in the claims is used to mean "and/or" unless explicitly indicated to refer to alternatives only or the alternatives are mutually exclusive, although the disclosure supports a definition that refers to only alternatives and "and/or." As used in this specification and claims, the words "comprising" (and any form of comprising, such as "comprise" and "comprises"), "having" (and any form of having, such as "have" and "has"), "including" (and any form of including, such as "includes" and "include") or "containing" (and any form of containing, such as "contains" and "contain") are inclusive or open-ended and do not exclude additional, unrecited elements or method steps.

Throughout this application, the term "about" is used to indicate that a value includes the inherent variation or error for the device, the method being employed to determine the value, or the variation that exists among the study subjects. For example but not by way of limitation, when the term "about" is utilized, the designated value may vary by +/- twelve percent, or +/- eleven percent, or +/- ten percent, or +/- nine percent, or +/- eight percent, or +/- seven percent, or +/- six percent, or +/- five percent, or +/- four percent, or +/- three percent, or +/- two percent, or +/- one percent, or +/- one-half percent. As used herein the symbol "+/-" indicates "plus or minus".

The use of the term "at least one" will be understood to include one as well as any quantity more than one, including but not limited to, 2, 3, 4, 5, 6, 7, 8, 9, 10, 11, 12, 13, 14, 15, 16, 17, 18, 19, 20, 21, 22, 23, 24, 25, 30, 35, 40, 45, 50, 55, 60, 65, 70, 75, 80, 85, 90, 95, 100, or more. The term "at least one" may extend up to 500 or 1000 or more, depending on the term to which it is attached; in addition, the quantities of 500/1000 are not to be considered limiting, as higher limits may also produce satisfactory results. In addition, the use of the term "at least one of X, Y and Z" will be understood to include X alone, Y alone, and Z alone, as well as any combination of X, Y and Z. The use of ordinal number terminology (i.e., "first", "second", "third", "fourth", etc.) is solely for the purpose of differentiating between two or more items and is not meant to imply any sequence or order or importance to one item over another or any order of addition.

The term "or combinations thereof" as used herein refers to all permutations and combinations of the listed items preceding the term. For example, "A, B, C, or combinations thereof" is intended to include at least one of: A, B, C, AB, AC, BC, or ABC, and if order is important in a particular context, also BA, CA, CB, CBA, BCA, ACB, BAC, or CAB. Continuing with this example, expressly included are combinations that contain repeats of one or more item or term, such as BB, AAA, AAB, BBC, AAABCCCC, CBBAAA, CABABB, and so forth. The skilled artisan will understand that typically there is no limit on the number of items or terms in any combination, unless otherwise apparent from the context.

As used herein, the term "substantially" means that the subsequently described event or circumstance completely occurs or that the subsequently described event or circumstance occurs to a great extent or degree or that the subsequently described event or circumstance occurs to the extent or degree indicated. For example, the term "substantially" means that the subsequently described event or circumstance occurs at least 90% of the time, or at least 95% of the time, or at least 98% of the time. Also, the term "substantially" will be understood to allow for minor variations and/or deviations that do not result in a significant impact thereto.

As will be used herein, directional terms, such as "above", "below", "upper", "lower", "top", "bottom", "overlaying", "underlying", etc. are used for convenience in referring to the accompanying drawings and descriptions thereof. In general, the terms "above", "upper", "top", "overlaying", and other similar terms refer to portions or a position of the structure or device having a higher bandgap and are closer to the thermal EMR emitter, and the terms "below", "lower", "bottom", "underlying", and other similar terms refer to portions or a position of the structure or device having a lower bandgap than adjacent portions and are positioned further away from the thermal EMR emitter. It should be appreciated that use of these relative terms do not require that the apparatus be operated in a particular orientation.

As used herein, the terms "IV-VI", "IV-VI semiconductor alloy", and "IV-VI semiconductor structure" is a Group IV-VI alloy compound where at least one of its constituent element components is an element from Group IV and at least one element is from Group VI of the periodic table of elements. The IV-VI alloy or structure may contain more than one element from either or both of Group IV and Group VI and may also contain elements from other columns in the periodic table, for example, such as strontium from Group IIA, silver from Group I, or bismuth from Group V.

Described herein are new semiconductor structures, TPV devices composed of the new semiconductor structures, and electrical power generation systems, composed of the devices, that are capable of capturing EMR further into the infrared spectrum to produce higher power levels per surface area, are not susceptible to excessive cell heating, can be manufactured at low cost, have a smaller physical footprint, and are more environmentally friendly than conventional devices and systems. Moreover, the novel semiconductor structures, TPV devices, electrical power generation systems, and methods of fabricating the same, as disclosed herein, efficiently absorb electromagnetic radiation directly from a thermal EMR emitter without the need of a spectral filtering system.

Various embodiments of the new IV-VI semiconductor structures, new TPV devices composed of the new IV-VI semiconductor structures, electrical power generation systems having the IV-VI semiconductor structures and devices, and methods of fabricating the same are described herein and provide for efficient and scalable apparatuses and systems that are capable of efficiently absorbing EMR directly from a thermal EMR emitter without the need of a spectral filtering system and are not susceptible to excessive junction heating. In certain non-limiting embodiments, for example, the semiconductor materials, TPV devices, and systems described herein are capable of use in concentrated photovoltaic (CPV) systems and are capable of achieving ≥50% efficiencies and reducing PV cell heating.

In addition, in various embodiments, the described structures, devices, and systems may be used with any thermal EMR emitter, such as in a combined heat and power (CHP) system, used with natural gas, or existing products such as water heaters, space heaters, and electrical generators with integrated absorption chillers. Accordingly, in certain embodiments, the semiconductor structures, TPV devices and energy conversion systems described herein are capable of working around the clock and are not limited to exposure to the sun.

In at least one embodiment, for example, a 10 kilowatt (kW) generator incorporating the IV-VI semiconductor structures and devices described herein may be the size of a 2 liter (L) bottle. In at least some embodiments, the described semiconductor structures, TPV devices and systems are more environmentally friendly and capable of producing higher power generation densities than currently available semiconductor structures, devices and systems.

In certain embodiments, the novel semiconductor structures, TPV devices composed of the semiconductor structures, electrical power generation systems, and methods of fabricating the same described herein are capable of capturing infrared radiation, for example, from about 1 μm to about 7 μm and converting the captured radiation into electricity.

The materials utilized in the described semiconductor structures, TPV devices, energy generation systems, and methods described herein include, but are not limited to, aluminum, copper, and narrow bandgap IV-VI semiconductor alloy materials that are sensitive to near-infrared and mid-infrared wavelengths. For example, utilizing the methods described herein, six pounds of IV-VI semiconductor material can be engineered into thin film IV-VI semiconductor structures which can be used to product 25.0 megawatts (MW) of electrical power—enough to power more than 2,500 homes.

The presently disclosed inventive concepts will now be further described by reference to the following examples, figures, and embodiments, which are included merely for purposes of illustration of certain aspects and embodiments of the presently disclosed inventive concepts, and are not intended to limit the presently disclosed inventive concepts. The following detailed description of examples and methods describes how to make and use the various structures and devices of the presently disclosed inventive concepts and are to be construed, as noted above, only as illustrative, and not limitations of the preceding disclosure in any way whatsoever. Those skilled in the art will promptly recognize appropriate variations from the structures, compositions, and procedures.

Figure 3:
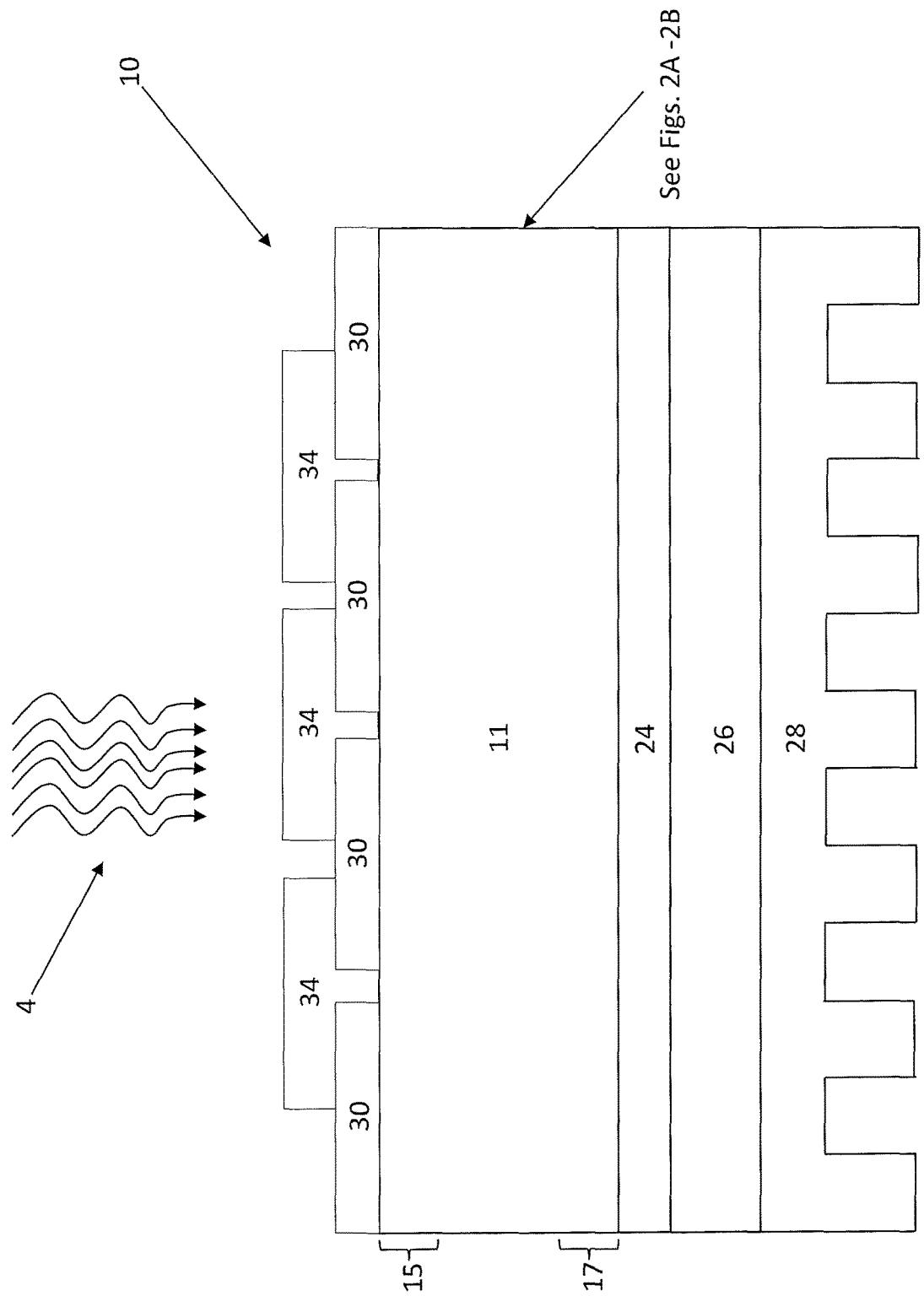
FIG. 3 depicts one embodiment of a TPV device configuration having a semiconductor structure therein.

FIG. 1 depicts an energy conversion system 1 utilizing TPV device 10, a TPV module 110, or an array of TPV modules 210, having one or more semiconductor structure 11 therein. The energy conversion system 1 includes a thermal EMR emitter 2 configured to emit EMR 4 where a portion of the emitted electromagnetic radiation 4 is in the infrared wavelength range. TPV device 10, TPV module 110, and TPV array 210 are each configured to absorb the emitted infrared wavelength electromagnetic radiation 4 and convert the absorbed infrared wavelength radiation into electricity. FIG. 3 depicts one embodiment of TPV device 10 including a semiconductor structure 11.

IV-VI semiconductor structure 11 is configured to absorb electromagnetic radiation emitted from a thermal EMR emitter 2. The IV-VI semiconductor structure 11 may be a binary, ternary, quaternary, or n-ary (where "n" is the number of different elements in the IV-VI semiconductor material) IV-VI semiconductor alloy structure. As depicted in FIG. 2A, structure 11 is made up of at least a single epitaxially grown junction 12. Each junction 12 is a pn junction comprised of an n-type layer 14 overlying a p-type layer 16. N-type layer 14 may be doped with bismuth, indium, or aluminum. P-type layer 16 may be doped with silver or thallium. Other dopants for n-type layer 14 and p-type layer 16 that achieve the functionality, characteristics, or results described herein are also suitable.

Junction 12 has a bandgap energy ($E_g$) and is configured to capture a specific range of infrared wavelengths. The bandgap of junction 12 has an absorption edge energy (or cutoff wavelength) that is substantially matched to the wavelength of the incident light or spectral emission from thermal EMR emitter 2. For example, as used in this paragraph, substantially matched means within +/−20%. The composition and thickness of junction 12 affects the bandgap of junction 12 and the photocurrent generated in the junction.

Figure 2B:
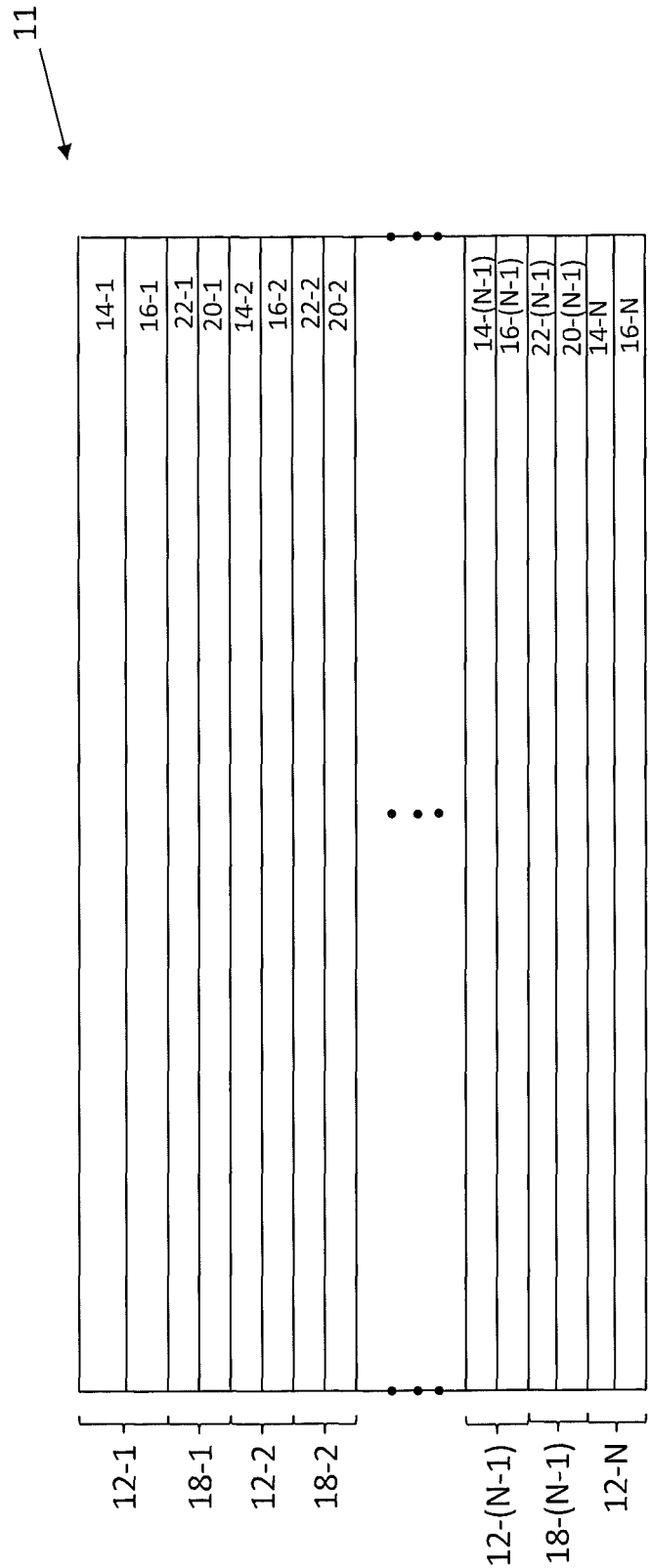
FIG. 2B depicts a stacked multi junction semiconductor structure configuration.

FIG. 2B depicts a multi-junction semiconductor structure 11 having (N) epitaxially grown stacked junctions 12 electrically connected together in series via (N−1) tunnel junction 18, where N is an integer greater than or equal to 1. Each junction 12 has a different bandgap and is configured to capture different ranges of infrared wavelength. Each junction may be comprised of a material with a lattice parameter that is nearly the same, for example, within about 1% of each other. Each junction 12 is arranged and configured to have substantially the same photogenerated current of adjacent junctions within +/−20% and thereby maximize the power produced since the current in a multi-junction cell is limited to the lowest current junction. Each junction 12 may be compositionally different. As used herein, compositionally different means that each junction is composed of the same alloy compound where the concentration of one or more constituent elements is different; or that each junction 12 is composed of different alloy compounds having different constituent elements.

Referring to FIG. 2B, junction 12-1 is above and overlies junction 12-2 and junction 12-1 has a larger bandgap than junction 12-2. The configuration repeats down to Nth junction 12-N with the bandgap of each lower junction is less than the above junction, e.g. $E_{g12\text{-}1} > E_{g12\text{-}2} > \ldots E_{g12\text{-}(N\text{-}1)} > Eg_{g12\text{-}N}$.

Figure 4:
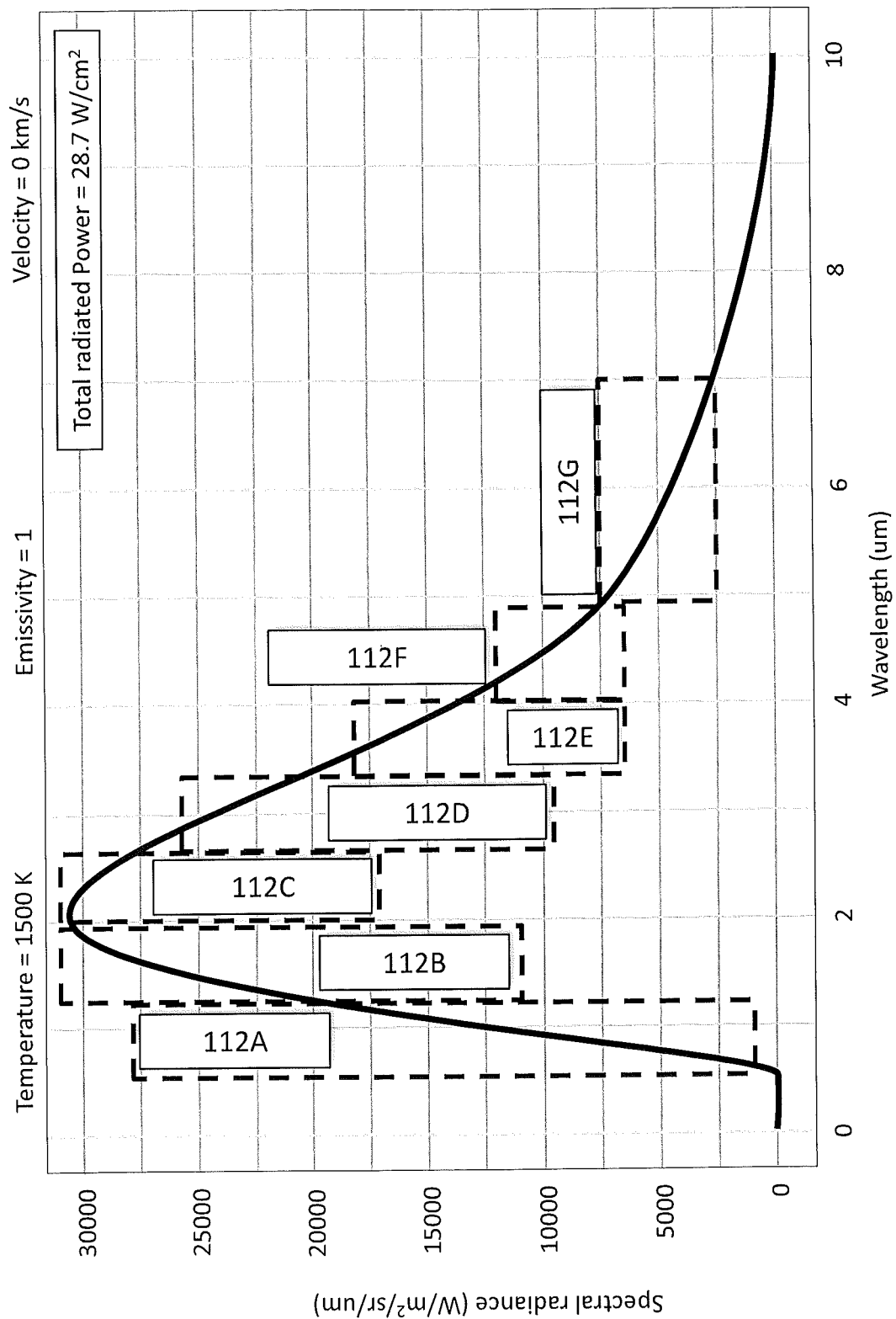
FIG. 4 is a spectral emission plot from a 1500K EMR emitted divided into seven optical absorption bands for a seven-junction IV-VI semiconductor structure having varying junction compositions.
Figure 5:
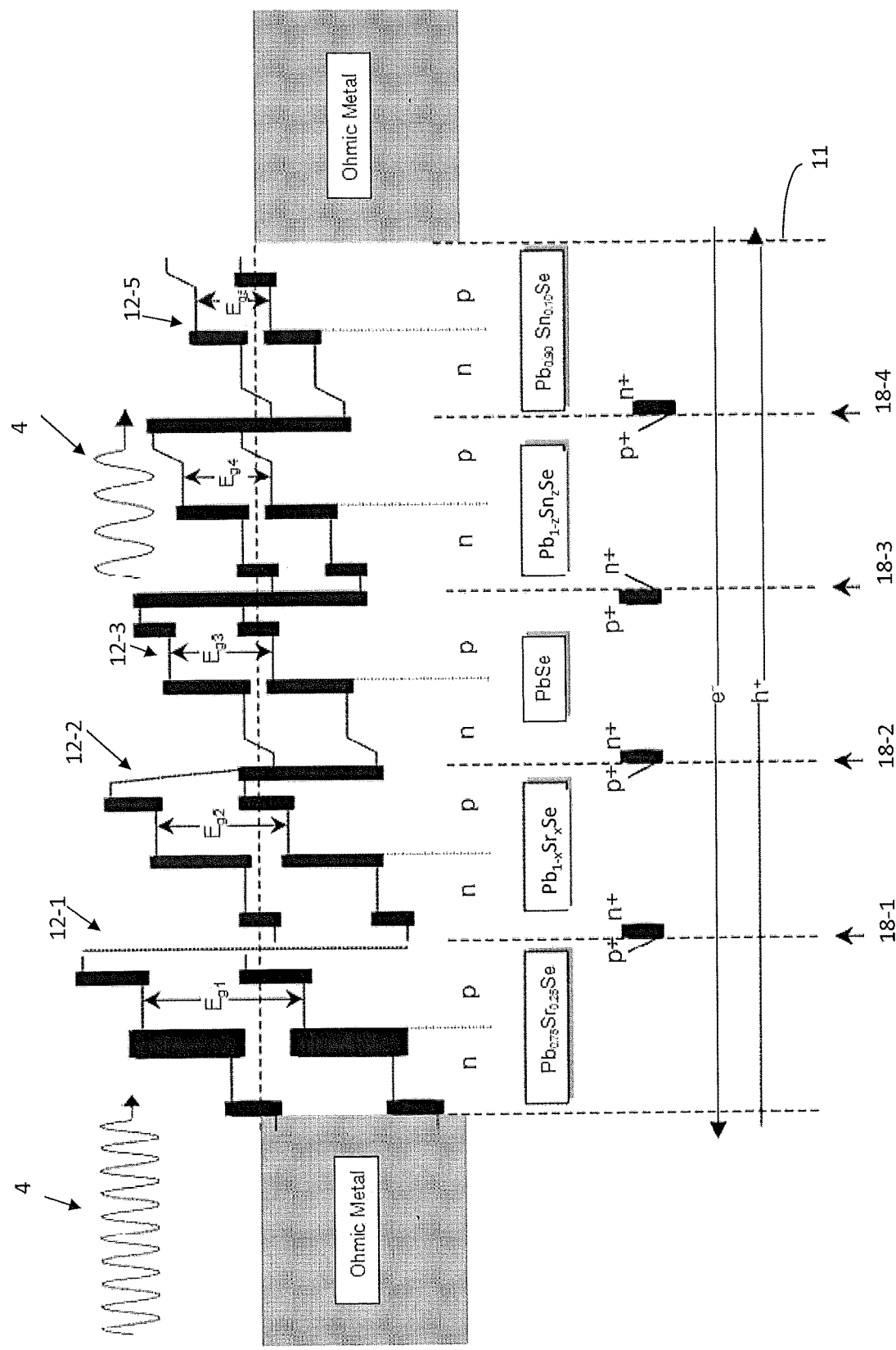
FIG. 5 illustrates a band diagram of a stacked five-junction IV-VI semiconductor structure in equilibrium conditions.

FIG. 4 depicts an example spectral band division of a seven junction IV-VI semiconductor structure 11 configured to capture infrared radiation in seven different spectral bands. Junctions with higher bandgaps overlie junctions having lower bandgaps. It should be appreciated that the emitted EMR 4 will first be incident on junctions with higher bandgaps before junctions with lower bandgaps; as a result, structure 11 may be oriented horizontally, as depicted in FIG. 5, or in any direction such that junctions having higher bandgaps receive emitted EMR 4 before junctions with lower bandgaps.

Referring to FIG. 4, the bandgap of junction 112A is greater than the bandgap of junction 112B, which, in turn, has a greater bandgap than junction 112C, and so on down to junction 112G. Stated differently, junction 112A is configured to capture higher energy photons (i.e. photons having shorter wavelengths) than junction 112B, and 112B is configured to capture higher energy photons than junction 112C and so on down to junction 112G.

Each pair of adjacent junctions, (for example, junctions 112A and 112B is a pair of adjacent junctions, and junctions 112B and 112C is another pair of adjacent junctions), has a top junction and a bottom junction, the top junction (or overlying junction) is the junction having the higher bandgap of the junction pair. For example, for the junction pair of 112A and 112B, junction 112A is the top junction and junction 112B is the bottom junction.

For each pair of adjacent junctions, the top junction is a thickness sufficient to serve as an anti-reflective (AR) coating for the underlying junction of the pair. The thickness of each junction assists in maximizing light collection efficiency for the underlying junction and better operational performance of structure 11.

To enhance the transmission of light to an underlying junction, the wavelength of light inside the junction providing the AR coating is an integer multiple of one-fourth the free space wavelength of the overlying junction divided by the refractive index of the overlying junction. Equation 1 represents the mathematical representation for wavelength of light inside the junction providing the AR coating as well as providing one embodiment of a method for the calculation for the minimum thickness for the junction providing the AR coating.

$$\frac{1}{4}\left(\frac{\text{Free space wavelength}}{\text{refractive index}}\right) \quad \text{Equation 1}$$

IV-VI semiconductor structure 11 is composed of a lattice matched IV-VI alloy having the formulation of $Pb_{1-x \text{ or } 1-z}(A_x)(B_z)Y$, where x and z are mole fractions of the constituent element and $0.0 \leq x < 0.3$ and $0.0 \leq z < 0.1$, and when x>0 then z=0, and when z>0 then x=0. In one embodiment, the element of $A_x$ is selected from the group consisting of strontium (Sr), and/or europium (Eu). Strontium and europium increase the bandgap of the IV-VI alloy. In one embodiment, B is selected from the group consisting of tin (Sn). Tin decreases the bandgap of the IV-VI alloy. In one embodiment, Y may be one or more elements chosen from selenium (Se), sulfur (S), and tellurium (Te).

Junctions with decreasing concentrations of strontium are indicated by reference numeral 15. Reference numeral 15 is also used herein to indicate the top end of semiconductor structure 11. In one embodiment one or more junctions 12 of the IV-VI semiconductor structure 11 is in the form of $Pb_{1-x}Sr_xSe$ with decreasing strontium concentrations in underlying junctions 12; and one or more junctions 12 of the IV-VI semiconductor structure 11 is in the form of $Pb_{1-z}Sn_zSe$ with increasing tin concentrations in underlying junctions. Junctions with increasing tin concentrations are indicated by reference numeral 17. Reference numeral 17 is also used herein to indicate the bottom end of semiconductor structure 11.

The concentrations of strontium and tin will vary depending on the temperature of thermal EMR emitter 2. For example, in one embodiment, when thermal EMR emitter 2 is greater than 1500 Kelvins (K), the maximum concentration of strontium will be greater than 0.25 and the maximum concentration of tin will be less than or equal to 0.09 (i.e. $0.0 \leq z \leq 0.09$). For a thermal EMR emitter 2 at a temperature of less than or equal to 1500K, in one embodiment, the maximum concentration of strontium will be less than or equal to 0.25 (i.e. $0.0 \leq x \leq 0.25$) and the maximum concentration of tin will be greater than 0.09.

Referring back to the stacked seven-junction IV-VI structure 11 in FIG. 4, each junction 112 has a different bandgap and is configured to capture a different range of EMR 4 for an EMR emitter 2 at about 1500K. Table 1 provides example junction 112 alloy configurations having varying concentrations of strontium and tin and each junctions' corresponding approximate bandgap and approximate cutoff wavelength. It should be appreciated that Table 1 is an example of some compositions for each junction; accordingly, depending on the application and use of structure 11, the compositions for each junction may vary and are not limited to the shown compositions.

TABLE 1

| Junction | Junction composition | Approximate Bandgap (meV) | Approximate Cutoff Wavelength (μm) |
|---|---|---|---|
| 112A | $Pb_{0.75}Sr_{0.25}Se$ | 736 | 1.7 |
| 112B | $Pb_{0.84}Sr_{0.16}Se$ | 622 | 2.0 |
| 112C | $Pb_{0.935}Sr_{0.065}Se$ | 444 | 2.8 |
| 112D | $Pb_{0.965}Sr_{0.035}Se$ | 377 | 3.3 |
| 112E | PbSe | 278 | 4.5 |
| 112F | $Pb_{0.975}Sn_{0.025}Se$ | 249 | 5.0 |
| 112G | $Pb_{0.915}Sn_{0.085}Se$ | 178 | 7.0 |

The seven-junction structure 11 of Table 1 is capable of capturing infrared EMR from about 1.0 μm up to about 7.0 μm. It should be appreciated that varying combinations of IV-VI structure 11 can be fabricated to capture specific wavelengths, for example, a single junction structure having a cutoff wavelength of about 2.0 μm, or a multi-junction structure configured to capture between 4.5 μm up to about 7.0 μm, or other combinations are possible.

As shown in FIG. 2B, tunnel junction 18 is between a pair of adjacent junctions 12. Tunnel junction 18 electrically connects each pair of adjacent junctions in series. Tunnel junction 18 provides a low resistance series connection such that the efficiency of structure 11 is increased due to the larger open circuit voltages that can be delivered to a load and thus reduce Joule heating losses for the same power delivery. The total number of tunnel junctions 18 is one less than the total number junctions 12 in semiconductor structure 11.

Tunnel junction 18 is a degenerately doped $p^+n^+$ junction having an abrupt doping profile. Tunnel junction 18 has the configuration of a high acceptor doped $p^+$ layer 22 over a high donor doped $n^+$ layer 20 as shown in FIGS. 2B and 5. The $p^+$ layer 22 of tunnel junction 18 is proximate to p-type layer 16 of the overlying junction 12 (e.g., the junction with the higher bandgap of the adjacent junction pair) and $n^+$ layer 20 of tunnel junction 18 is proximate to the n-type layer 14 of the lower junction 12 (e.g. the junction with the lower bandgap of the adjacent junction pair) as shown.

By way of illustration, FIG. 5 depicts a band diagram of stacked five-junction IV-VI structure 11 incorporated into a TPV device 10 under equilibrium conditions with the directions of electron and hole flow indicated by $e^-$ and $h^+$, respectively. Each junction of the stacked five-junction IV-VI structure 11 has progressively smaller bandgaps each configured to absorb progressively longer wavelength photons as EMR 4 penetrates structure 11 from the left. Photons with insufficient energy for exciton generation in the left most junction 12-1 are absorbed in the underlying junctions. As shown in FIG. 5, the concentration of strontium for the higher bandgap junctions progressively decreases while the concentration of tin in the lower bandgap junctions progressively increases. As shown in FIG. 5 tunnel junctions 18 electrically connect the junctions 12 in series.

Figure 6:
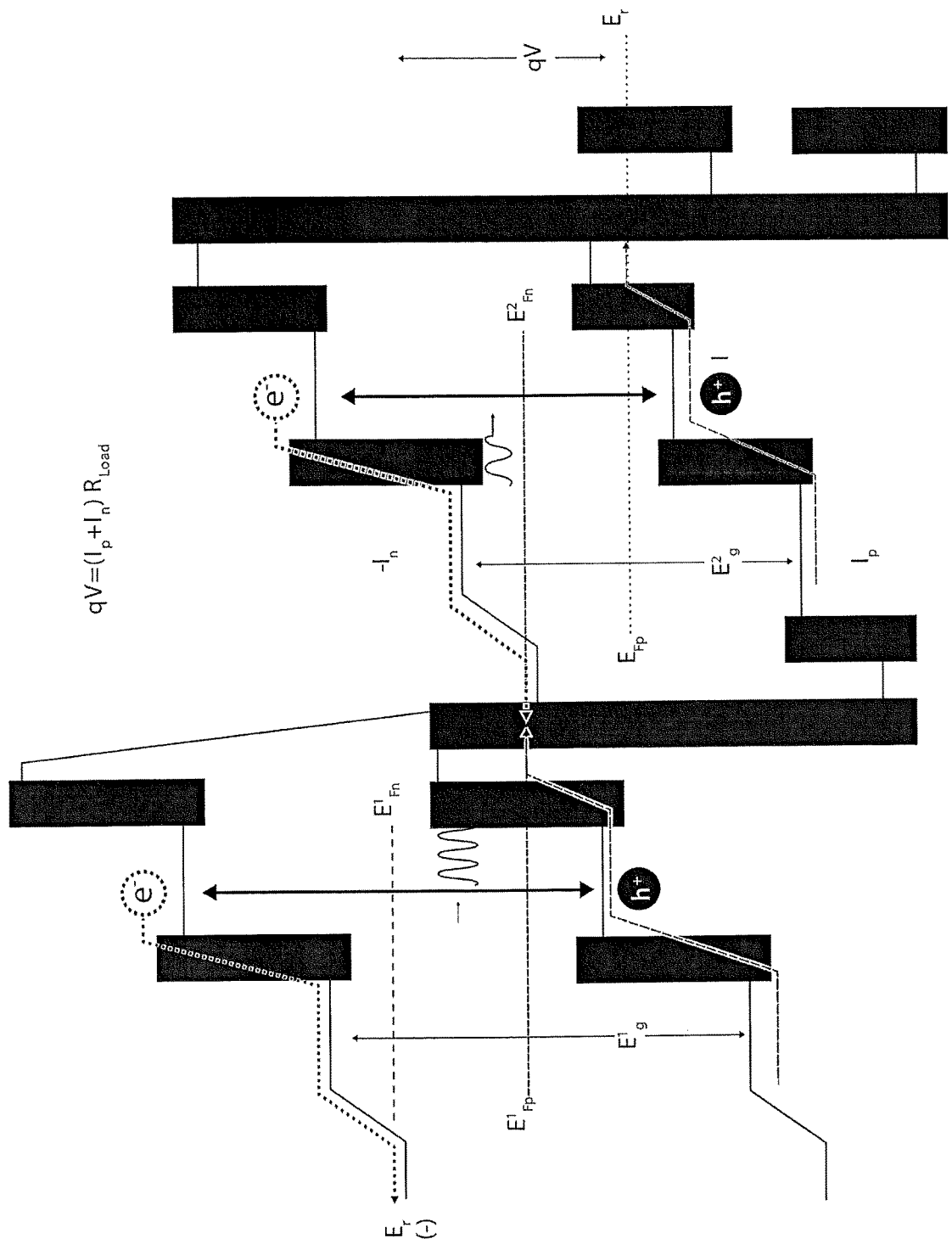
FIG. 6 shows a band diagram of a pair of adjacent junctions and a tunnel junction under non-equilibrium conditions.

By way of illustration, FIG. 6 depicts a band diagram of two adjacent junctions connected in series with a low resistance degenerately doped $p^+n^+$ junction tunnel junction 18 under non-equilibrium conditions (under conditions of infrared illumination and current flowing through a resistive load). As shown in FIG. 6, equal quasi Fermi energies for photogenerated holes and electrons in the adjacent junctions at tunnel junction 18 enables the delivery of a high voltage to a resistive load (not shown).

Tunnel junction 18 is configured to have a thickness such that the photogenerated currents in each junction are substantially matched. The thickness of tunnel junction 18 may be in the range of about 5 nanometers (nm) to about 30 nm within +/−5%. Tunnel junction 18 may be composed of IV-VI semiconductor alloy materials having the same formulation as one of the adjacent photovoltaic junctions.

As will be described further below, IV-VI semiconductor structure 11 is suitable for incorporation and use in TPV devices for electrical power generation. IV-VI semiconductor structure 11 is also suitable for incorporation into other devices and uses, such as photovoltaic detectors for scientific instrumentation and thermal imaging, as well as mid-infrared lasers for optical countermeasures and chemical sensing.

FIG. 3 depicts TPV device 10 incorporating the described IV-VI structure 11. TPV device 10 also includes a metallization layer 24, a host substrate 26, an aluminum heat sink 28, passivation layer 30, and contacts 34. The heat sink 28 may serve as the bottom-side contact of TPV device 10. TPV device 10 is configured to absorb EMR 4 directly from thermal EMR emitter 2 without requiring a spectral filtering system. The TPV device 10 described herein can achieve radiated heat-to-electricity efficiencies of greater than 50%.

As previously discussed, in certain embodiments, each junction 12 may be configured to provided an AR coating for the next underlying junction. The parameters and equation for calculating the thickness for each junction 12 are provided above with reference to Equation 1. Equation 1 is also applicable to passivation layer 30 of TPV device 10. Passivation layer 30 may also function as an anti-reflective coating layer for TPV device 10. Suitable materials that can be used as passivation layer 30 and also function as an anti-reflective coating for the top most junction 12 include aluminum nitride (AlN), calcium fluoride ($CaF_2$), magnesium fluoride ($MgF_2$), silicon dioxide ($SiO_2$), or silicon nitride ($Si_3N_4$). For example, with reference to Table 2, the widest bandgap junction 12A has the formulation of $Pb_{0.88}Sr_{0.12}Se$. The shortest wavelength of light collected by junction 12A will be about 1.0 μm. The minimum thickness of an AlN anti-reflective coating that provides for efficient transmission in underlying junction 12A will be approximately 116 nm.

Similarly, junction 12A of Table 2 is configured to be an anti-reflective coating for its underlying adjacent junction 12B. Junction 12A has an index of refraction of about 4.2, the 3.3 μm light collected by underlying junction 12B will have maximum transmission when the thickness of junction 12A is an integer multiple of 196 nm. The absorption coefficient of IV-VI semiconductor alloys is in the range of $10^5$ cm$^{-1}$ thus making it possible to achieve greater than 95% absorption in a junction that is approximately 600 nm thick. In at least one embodiment, for greater absorption, each junction 12 is at least approximately 600 nm thick.

TABLE 2

| | Composition | Free-space Wavelength (FSW)(μm) ±10% | Refractive Index (RI) | Minimum thickness (nm) $\frac{1}{4}\left(\frac{FSW}{RI}\right)$ ±10% | Example thickness (nm) (Integer multiples of minimum thickness) ±10% | | | | |
|---|---|---|---|---|---|---|---|---|---|
| | | | | | 2x | 3x | 4x | 5x | 6x |
| 30 | AlN | 1.00 | 2.15 | 116 | 232 | 348 | 464 | 580 | 696 |
| 30 | $CaF_2$ | 1.00 | 1.43 | 175 | 350 | 525 | 700 | 875 | 1050 |
| 12A | $Pb_{0.88}Sr_{0.12}Se$ | 3.30 | 4.20 | 196 | 392 | 588 | 784 | 980 | 1176 |
| 12B | PbSe | 4.50 | 4.50 | 250 | 500 | 750 | 1000 | 1250 | 1500 |
| 12C | $Pb_{0.95}Sn_{0.05}Se$ | 6.00 | 5.00 | 300 | 600 | 900 | 1200 | 1500 | 1800 |

In at least one embodiment, each junction 12 in a multi-junction IV-VI semiconductor structure 11 is configured to have substantially matched photogenerated current flow. Thickness of each junction 12 affects the current of each junction; as a result, the available thickness ranges for each junction 12 to provide an anti-reflective coating should be determined and then the selection of the best combination of thicknesses of each junction to obtain substantially matched currents from each junction should be made. For example, a $Pb_{0.88}Sr_{0.12}Se$ layer that is 588 nm thick can be on top of a PbSe layer that is 750 nm thick, and both can be on top of a $Pb_{0.95}Sn_{0.05}Se$ layer that is 900 nm thick.

Some embodiments of the fabrication of the IV-VI semiconductor structure 11 are depicted in FIGS. 7, 8A, 8B, and 9. The growth techniques described can improve the performance of any minority carrier device that employs the IV-VI semiconductor structure 11 described herein.

IV-VI semiconductor structure 11 is produced using epitaxial growth of each layer, for example, the material deposition method can utilize molecular beam epitaxial (MBE). Typically, as a result of the residual strain due to thermal expansion mismatch between growth substrate 38 and the semiconductor material a high density of crystalline defects results. The method of fabrication described herein provides an epitaxially grown IV-VI semiconductor structure 11 with a reduced density of crystalline defects as a result of a unique strain relaxation mechanism that allows IV-VI material to deform plastically. Growth substrate temperatures for high crystalline quality IV-VI semiconductor epitaxial growth are typically in the range of, but not limited to, about 300° C. to about 350° C.

Figure 7:
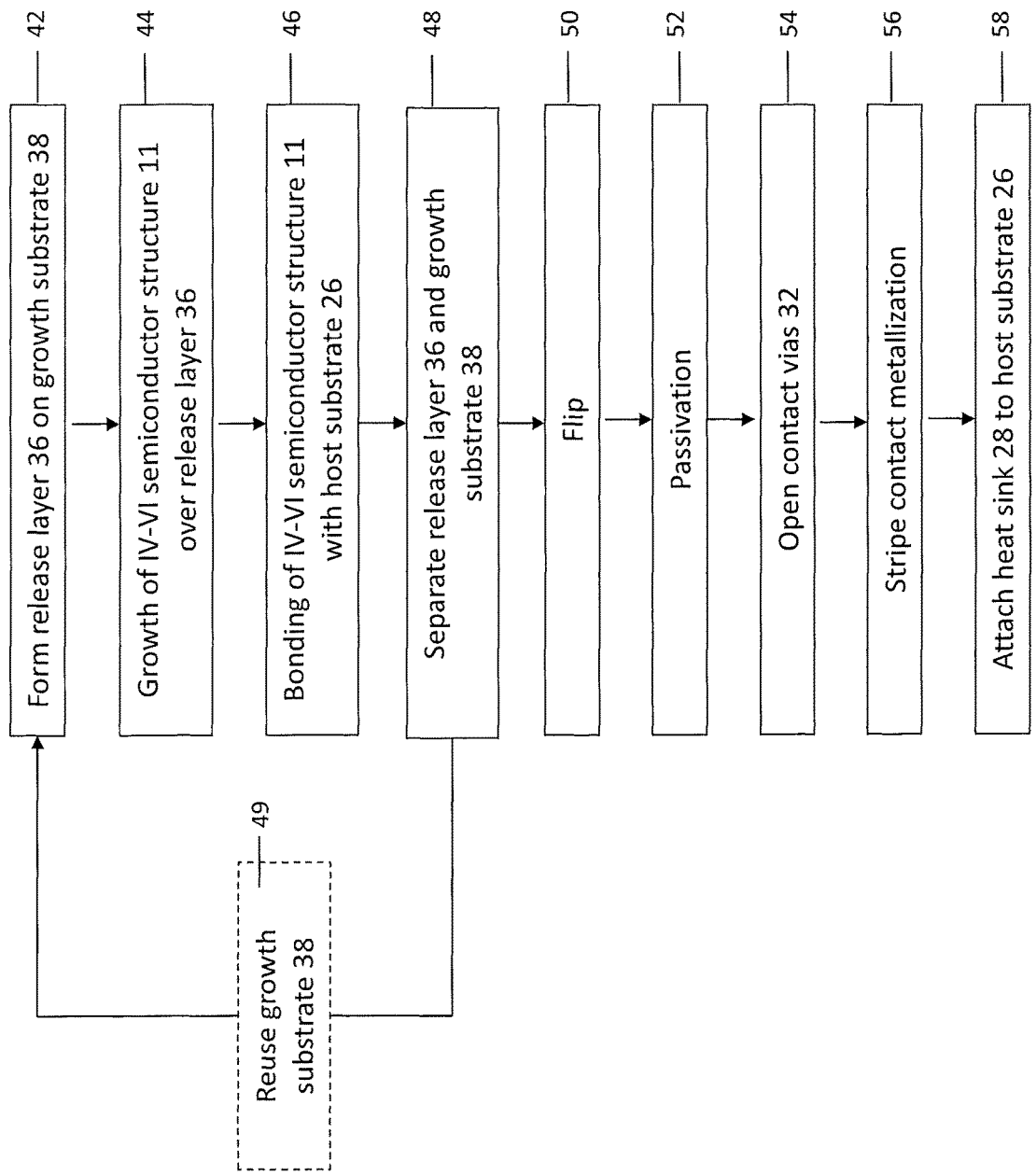
FIG. 7 is a flow chart of the fabrication steps of a IV-VI semiconductor structure and TPV device.

At step 42 in FIG. 7, a release layer 36 is formed on a growth substrate 38. Growth substrate 38 is a silicon wafer but may be any suitable growth substrate. Release layer 36 may also be referred to as buffer layer 36. Release layer 36 is a water soluble fluoride buffer layer material, a non-limiting example includes barium fluoride ($BaF_2$). The use of a water soluble fluoride release layer 36 provides for the release of growth substrate 38. To form release layer 36 on growth substrate 38, a thin calcium fluoride ($CaF_2$) layer may optionally be grown on growth substrate 38. The ionic $CaF_2$ has a similar lattice parameter, as shown in Table 3, converts the silicon growth substrate 38 from a covalently bonded structure to an ionic bonded such that a $BaF_2$ layer may be formed upon growth substrate 38.

TABLE 3

| Layer or Substrate | Lattice Parameter (Å) | Thermal Expansion Coefficient ($10^{-6}$/K at 300K) | Thermal Conductivity (Watt/mK) |
|---|---|---|---|
| PbSe | 6.126 | 19.0 | 2.0 |
| PbTe | 6.460 | 19.8 | 2.3 |
| $BaF_2$ | 6.200 | 19.8 | 11.7 |
| $CaF_2$ | 5.460 | 19.2 | 9.7 |
| Silicon (Si) | 5.431 | 2.60 | 148 |
| Copper (Cu) | — | 17.0 | 398 |
| Aluminum (Al) | — | 23.0 | 205 |

Figure 8A:
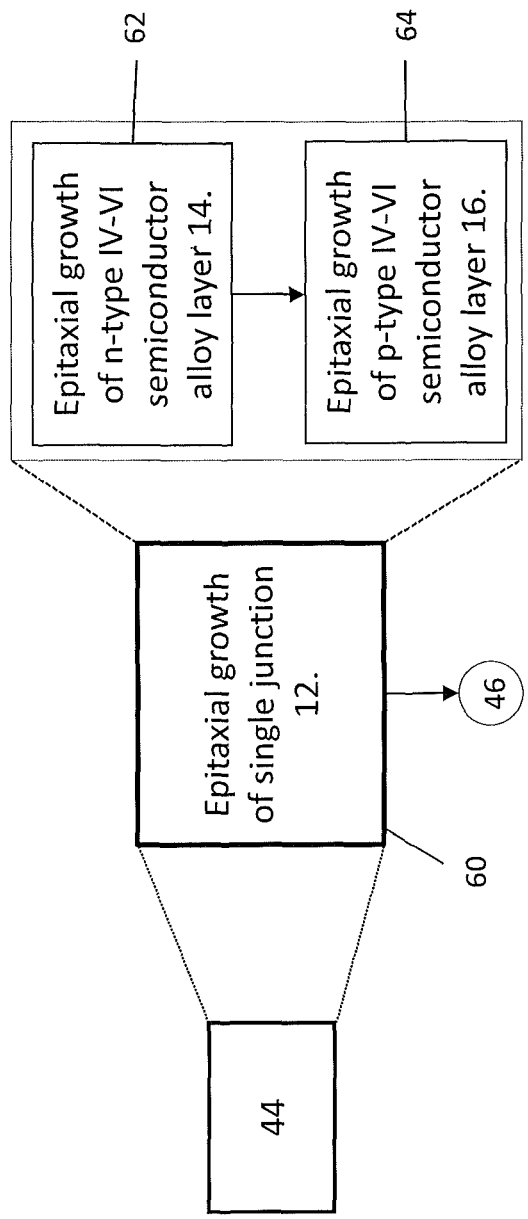
FIG. 8A is a detailed view of the steps of the epitaxial growth step of a single junction semiconductor structure.

The method proceeds to step 44, the epitaxial growth of IV-VI semiconductor structure 11 over release layer 36. A pictorial representation of step 44 can be seen in FIG. 9 at step (a). As shown in FIG. 9(a), release layer 36 is between IV-VI semiconductor structure 11 and growth substrate 38. FIG. 8A depicts one embodiment of the steps for the epitaxial growth of a single junction IV-VI semiconductor structure 11 and FIG. 8B depicts one embodiment of the steps for the epitaxial growth of a stacked multi junction IV-VI semiconductor structure 11.

As shown in FIG. 8A, the epitaxial growth of a single junction 12 is depicted by step 60 which comprises two steps therein. As shown in step 62, epitaxial growth of n-type layer 14 occurs before the epitaxial growth of p-type layer 16 at step 64.

Figure 8B:
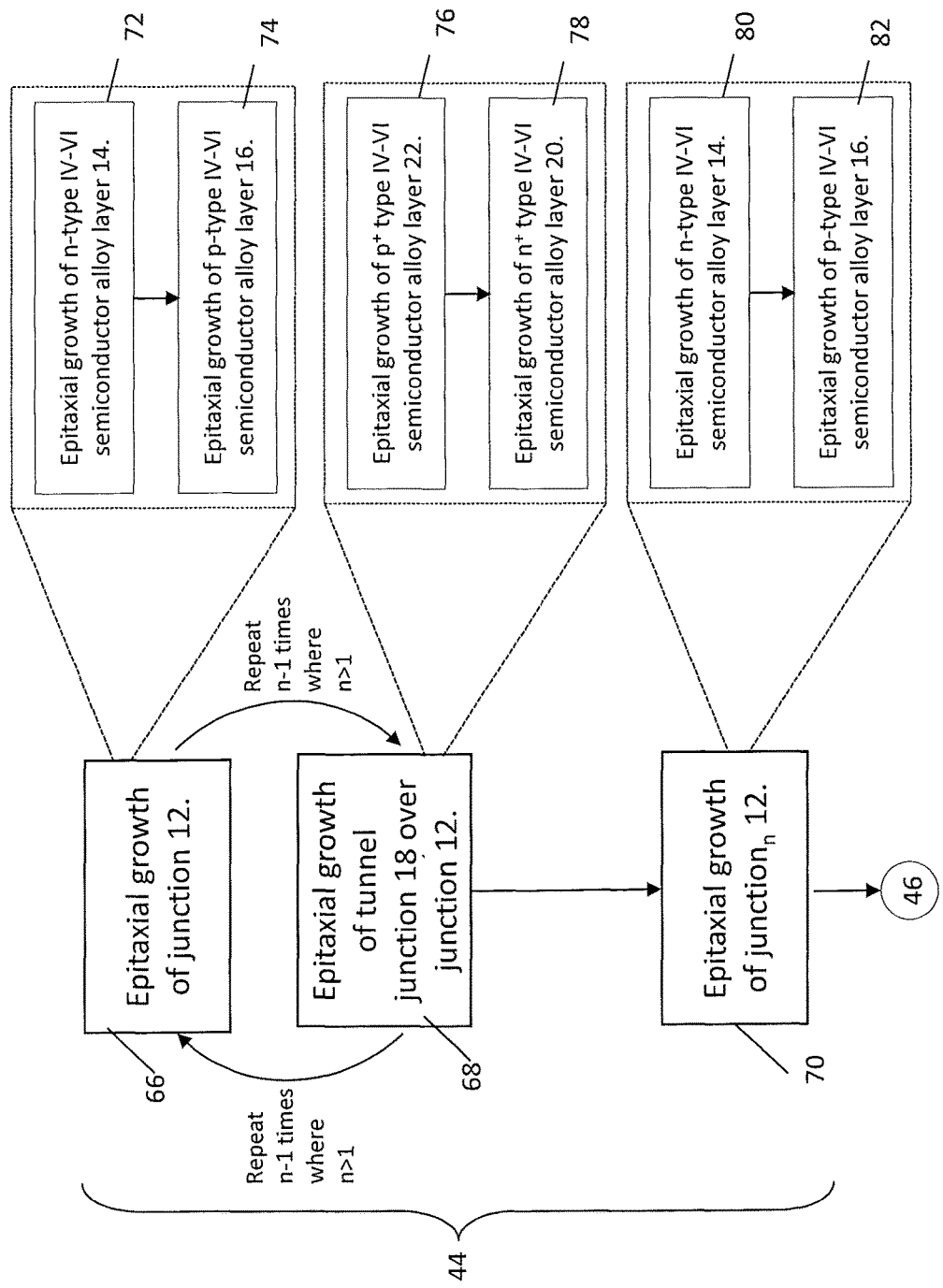
FIG. 8B is a detailed view of the steps of the epitaxial growth step of a multi-junction semiconductor structure.
Figure 9:
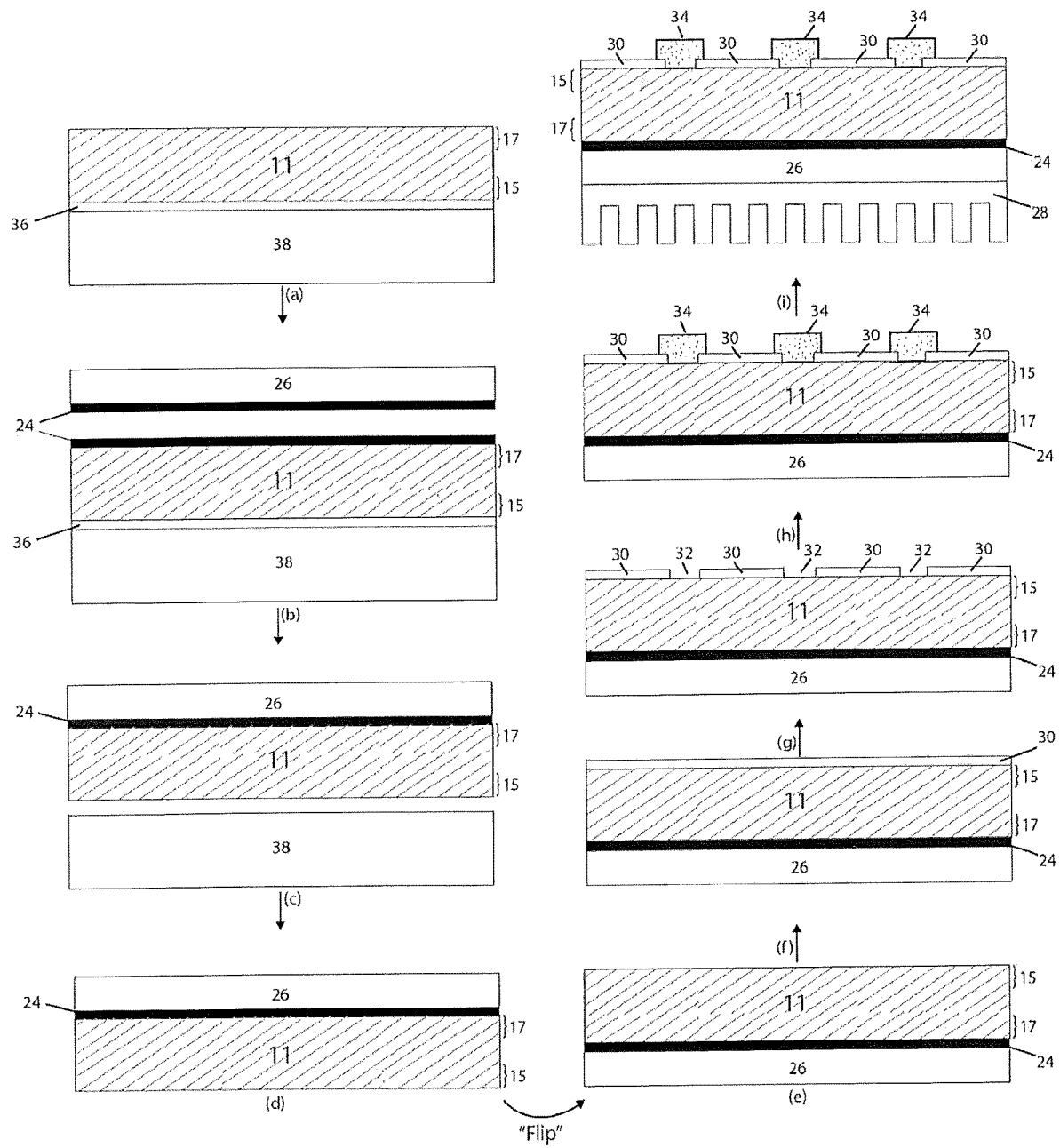
FIG. 9 is a pictorial flow chart of the fabrication steps of a semiconductor structure and TPV device.

For a multi-junction IV-VI semiconductor structure 11, the fabrication steps are represented in FIG. 8B. Each junction is grown on top of previously grown junctions, thus resulting in a stacked multi-junction IV-VI semiconductor structure 11. At step 66, the first junction 12 of multi junction IV-VI semiconductor structure 11 is epitaxial grown. The growth of junction 12 includes two steps, as shown in steps 72 and 74. For each junction 12, at step 72, n-type layer 14 is epitaxially grown followed by the epitaxial growth of p-type layer 16 at step 74.

The process proceeds to step 68 where tunnel junction 18 is epitaxially deposited over first junction 12. The growth of tunnel junction 18 includes two steps, the epitaxial growth of $p^+$ type layer 22 at step 76 followed by the growth of $n^+$ type layer 20 at step 78. Steps 66 and 68 are repeated N−1 times, where N is the total number of junctions 12. As previously discussed, the total number of tunnel junctions 18 is one less than the total number of junctions 12 in multi-junction IV-VI semiconductor structure 11 and each tunnel junction 18 is configured to connect adjacent junctions 12 electrically in series. As previously discussed, each junction 12 in multi-junction IV-VI semiconductor structure 11 is compositionally different.

After the last tunnel junction 18 is deposited, the process proceeds to step 70 where the final junction 12 is epitaxially grown. Similar to the other junctions 12, the epitaxial growth of the final junction includes the deposition of n-type layer 14 at step 80 followed by the deposition of p-type layer 16 at step 82.

The junctions that are grown first in the above described process are the junctions that form the top end 15 of semiconductor structure 11 and have the higher (or greater) bandgaps than the junctions grown later in the process that are near the bottom end 17 of semiconductor structure 11. For example, for multi-junction IV-VI semiconductor structure 11 having strontium and/or tin in one or more junctions, the junctions with the highest strontium content will be grown first and progressively decrease and the junction containing the highest tin content will be grown last. The pictorial representation of the grown IV-VI semiconductor structure 11 with the regions of higher strontium content 15 and higher tin content 17 is shown in FIG. 9.

Referring to FIG. 7, at step 46, the grown IV-VI semiconductor structure 11 and host substrate 26 are bonded via blanket metallization. Step 46 is pictorially represented by FIG. 9(b). A number of techniques can be used to accomplish metallization step 46, including but not limited to thermal evaporation, electron beam evaporation, electroplating, electroless plating, or any combination thereof.

Suitable, non-limiting, materials for host substrate 26 include a higher thermal and electrical conductivity material, such as copper or aluminum, that are metallized. The metallized structures 24 may include thin layers of copper, nickel, indium, tin, bismuth, silver, or gold, and combinations thereof. Copper is desirable due to its for high thermal and electrical conductivity; nickel provides for good adhesion to copper; indium, tin and bismuth are desirable due to their low melting temperatures; and silver and gold provide for surface passivation. These metallization structures 24 provide a low resistance ohmic contact to the top of IV-VI semiconductor structure 11 and a medium for metallurgical bonding to host substrate 26.

By transferring the MBE-grown IV-VI semiconductor structure 11 from silicon growth substrate 38, which has a small thermal expansion coefficient (see Table 3), to host substrate 26 which has a thermal expansion coefficient that is much closer to the alloys comprising IV-VI semiconductor structure 11 (for example, copper or aluminum), the amount of strain that occurs following high temperature growth is reduced. In addition, the metallized bonding layer 24 between host substrate 26 and IV-VI semiconductor structure 11 is, in certain embodiments, a eutectic metal with a liquidus temperature that is below 300° C. Strong surface tension forces keep IV-VI semiconductor structure 11 attached to host substrate 26. When IV-VI semiconductor structure 11 is cooled to room temperature following growth, the only strain to form in IV-VI semiconductor structure 11 may be due to the small amount of thermal expansion mismatch with host substrate 26 after the eutectic metal solidifies below 300° C.

Referring to FIG. 7 at step 48 and FIG. 9(c), growth substrate 38 is separated from IV-VI semiconductor structure 11 by dissolving the water soluble release layer 36 in water. With reference to FIG. 7, growth substrate 38 may optionally be reused as shown at step 49. Upon separation, growth substrate 38 may be cleaned by any cleaning method known in the art, including, but not limited to Shiraki cleaning and RCA cleaning. As a result, the entire growth substrate 38 can be reused and the process for growing semiconductor structure 11 repeated at step 42.

With reference to FIG. 7 at step 50, the transferred IV-VI semiconductor structure 11 is flipped over as pictorially depicted in FIGS. 9(d) and 9(e). This step may be referred to as "flip-chip bonding" as it is known in the art. As a result, the IV-VI semiconductor structure 11 is now on top for other processing steps to be deposited thereon.

With reference to FIGS. 7 and 9(f), the process of fabricating TPV device 10 having IV-VI semiconductor structure 11 proceeds to step 52 where an electrically insulating passivation layer 30 is deposited to reduce unwanted surface recombination. Passivation layer 30 may also function as an anti-reflective coating, provided it has a minimum thickness as previously discussed. In certain embodiments the processing conditions during passivation step 52 do not involve elevated substrate temperatures since high post-growth processing temperatures can cause dopants to interdiffuse. For example, this can cause a loss of the as-grown abruptly-doped tunnel junction(s) 18. Pulsed electron deposition (PED) may be suitable for passivation step 52. As previously discussed, suitable materials that can be used as passivation layer 30 and also function as an anti-reflective coating include, but are not limited to, aluminum nitride (AlN) or calcium fluoride ($CaF_2$). For example, thin layers of AlN may be deposited using PED at host substrate 26 temperatures as low as 250° C.

The process proceeds to step 54 where contact vias 32 are opened, as depicted in FIG. 9(g). The opening of contact vias 32 can be achieved through any method known in the art. At step 56, ohmic contacts 34 are deposited in one embodiment via stripe contact metallization, as depicted in FIG. 9(h). Alternatives to steps 52, 54, and 56 include, for example, selective deposition of the passivation layer 30 through a shadow mask to produce contact vias 32 without photolithographic processing.

To enhance efficiency of TPV device 10 and minimize losses associated with lack of light collection under opaque metal contacts 34, infrared transparent yet electrically conductive materials, such as but not limited to a semi-metal material like indium tin oxide (ITO) or other materials exhibiting similar properties, are suitable for use as contacts 34.

Lastly, at step 58, heat sink 28 configured for convective cooling is attached to host substrate 26 as pictorially shown in FIG. 9(i). The fabricated TPV device 10 may be electrically coupled in series and/or parallel to one or more other TPV devices 10 to form a module 110. Module 110 may be electrically coupled in series and/or parallel to one or more other modules 110 to form an array 210 of TPV devices 10. TPV device 10, module 110, and/or array 210 may be incorporated into any energy conversion system configured to convert EMR into electricity. In certain embodiments, the IV-VI semiconductor structure 11 and TPV devices 10 disclosed herein can result in a radiated-heat-to-electricity conversion efficacy that exceeds 50%.

EXAMPLES

The presently disclosed inventive concepts will now be addressed in reference to certain non-limiting examples. The present disclosure is not to be limited to the specific steps, experimentation, results, or laboratory procedures described in the examples. Rather, these examples are simply provided as several of various embodiments of the presently disclosed inventive concepts and are meant to be exemplary, not exhaustive.

Examples 1-4 describe the MBE epitaxial growth and fabrication of a single-junction IV-VI semiconductor structure 11, a stacked two-junction IV-VI semiconductor structure 11, a stacked three-junction IV-VI semiconductor structure 11, and a stacked four-junction IV-VI semiconductor structure 11, respectively. Each example provides a table illustrating various non-limiting embodiments of IV-VI semiconductor material alloys for each junction including its dopant, dopant concentration, target thicknesses, and fabrication conditions. With reference to the figures, these examples are illustrated in FIG. 7 at steps 42 and 44 and FIG. 9(a).

Example 1—Fabrication of a Single-Junction IV-VI Structure

Example 1 illustrates a single junction IV-VI semiconductor structure composed of a PbSe alloy having a target junction thickness of approximately 1.8 μm+/−20%. This IV-VI semiconductor structure is configured to have a bandgap of approximately 290 milli-electronvolt (meV) +/−15 meV and is configured to absorb infrared light in the range from about 4.2 microns to about 1.0 microns.

TABLE 4

| M222 | | |
|---|---|---|
| Layers (target thicknesses) | Open Shutters (time) | Doping, etc. |
| p-Contact PbSe (20 nm) | PbSe, Se, Ag (146 sec) | Ag-doped ~3 × $10^{19}$ cm$^{-3}$ BEP = 2.2 × $10^{-9}$ |
| p-Barrier $Pb_{0.93}Sr_{0.07}Se$ (30 nm) | PbSe, Sr, Se, Ag (219 sec) | (~1065° C.) |
| Heat Ag Cell | Se remains open | |
| p-type PbSe | PbSe (750 nm) | PbSe, Se, Ag (5,475 sec) | Ag-doped ~2.4 × $10^{18}$ cm$^{-3}$ BEP = 3.7 × $10^{-10}$ (~889° C.) |
| Lightly p-type (undoped) PbSe | PbSe (300 nm) | PbSe, Se (2,190 sec) | Undoped ~2 × $10^{17}$ cm$^{-3}$ |
| n-type PbSe | PbSe (750 nm) | PbSe, Se, $Bi_2Se_3$ (5,475 sec) | $Bi_2Se_3$-doped ~-3 × $10^{18}$ cm$^{-3}$ BEP = 9 × $10^{-10}$ (~850° C.) |
| Cool $Bi_2Se_3$ cell | Se remains open | |
| n-Barrier $Pb_{0.93}Sr_{0.07}Se$ (600 nm) | PbSe, Sr, Se, $Bi_2Se_3$ (4,380 sec) | $Bi_2Se_3$-doped ~-3 × $10^{19}$ cm$^{-3}$ BEP = 1 × $10^{-8}$ (~942° C.) |
| n-Contact PbSe (20 nm) | PbSe, Se, $Bi_2Se_3$ (146 sec) | |
| Cool CAR to 350° C. | Se remains open | |
| REACTION BaSe (<10 nm) | Se (300 sec) | Convert $BaF_2$ surface to BaSe |
| RELEASE $BaF_2$ (30 nm) | $BaF_2$ (480 sec) | |
| Heat CAR to 550° C. | Se remains closed | |

TABLE 4-continued

M222

| Layers (target thicknesses) | Open Shutters (time) | Doping, etc. |
|---|---|---|
| Measure PbSe, Sr, Se, Bi₂Se₃, Ag, & BaF₂ Fluxes Growth Interrupt—Wafer Parked in Buffer Chamber | | |
| Buffer* CaF₂ (4 nm) Oxide Desorption Si (111) | CaF₂ (120 sec) | CAR 800° C. CAR to ~1050° C. |

*Previously grown, M222a

With reference to the bottom of Table 4 and moving upwards, a three (3) inch (76.0 millimeter (mm)) diameter silicon growth substrate 38 having a (111) orientation is heated to a continuous azimuthal rotation (CAR) assembly temperature of about 850° C. Next, a calcium fluoride layer of approximately 2.0 nm to 4.0 nm is deposited on top of the silicon growth substrate at a CAR temperature of 800° C. Growth for 60 to 120 seconds with a $CaF_2$ beam equivalent pressure (BEP) of $1.2 \times 10^{-7}$ Torr will produce the desired thickness.

The CAR is then cooled to approximately 550° C. while the Se source shutter remains closed. A release layer 36 of barium fluoride is deposited for approximately 480 seconds for a target thickness of about 30 nm. The surface of the release layer is reacted with Se for approximately 300 seconds to convert the barium fluoride surface to approximately less than 10 nm (<10 nm) of BaSe. The CAR is cooled to approximately 350° C. for growth of the IV-VI semiconductor TPV device material.

An n-type contact layer of PbSe that is doped with $Bi_2Se_3$ with a dopant concentration of about $3 \times 10^{19}$ cm$^{-3}$ having a BEP of $1 \times 10^{-8}$ Torr for an effusion cell temperature of about 942° C. for approximately 146 seconds for a target thickness of about 20 nm. The n-type contact layer helps to reduce the contact resistance between the semiconductor and metallic materials used during module packaging. An approximately 600 nm thick n-type barrier layer in the form of $Pb_{0.93}Sr_{0.07}Se$ that is also doped with $Bi_2Se_3$ with the same dopant concentration and BEP is deposited during growth of the n-type-contact layer. A growth time with the indicated BEPs of approximately 4,380 seconds produces a layer that is approximately 600 nm thick. Once the $Bi_2Se_3$ effusion cell cools, the growth of an approximately 750 nm of n-type layer 14 of the n-type side of a single-junction IV-VI semiconductor structure 11 follows. The n-type side of the single-junction IV-VI semiconductor structure is doped with $Bi_2Se_3$ to produce an electron concentration of about $3 \times 10^{19}$ cm$^{-3}$. A $Bi_2Se_3$ BEP of about $9 \times 10^{-10}$ Torr produced by an effusion cell held at or about 850° C. will achieve this electron density.

Next, the p-type layer 16 is epitaxially grown. For this example, approximately a 300 nm undoped portion of p-type layer 16 was grown before the Ag-doped p-type layer. A Se BEP of about $1.22 \times 10^{-7}$ Torr produces p-type layer 16 with a hole density of about $2 \times 10^{17}$ cm$^{-3}$.

A silver doped p-type $Pb_{0.97}Sr_{0.03}Se$ layer 750 nm thick is then grown with a Ag BEP of about $3.7 \times 10^{-10}$ Torr to produce a hole density of about $2.4 \times 10^{18}$ cm$^{-3}$. The Ag effusion cell is then heated from about 889° C. to about 1069° C. to produce a BEP of about $2.2 \times 10^{-9}$ Torr for growth of an approximately 30 nm thick p-type $Pb_{0.97}Sr_{0.03}Se$ barrier layer followed by an approximately 20 nm thick p-type PbSe contact layer. The hole density in these layers is in the range of about $3 \times 10^{19}$ cm$^{-3}$.

Example 2—Fabrication of a Two Junction IV-VI Structure

Example 2 illustrates a stacked two-junction IV-VI semiconductor structure composed of a first junction in the form of $Pb_{1-x}Sr_xSe$, a second junction in the form of PbSe, and a tunnel junction in the form of PbSe is fabricated. For example, the stacked two-junction IV-VI semiconductor structure of Example 2 is configured to absorb infrared light in the range of about 4.2 microns to about 1.0 microns. This absorption is more efficient with two junctions because of a smaller quantum defect (the difference between the photon energy and the bandgap) when a wider bandgap material is part of the TPV cell design.

TABLE 5

M223

| Layers (target thicknesses) | | Open Shutters (time) | Alloying, Doping, etc. |
|---|---|---|---|
| p+ Contact | PbSe (20 nm) | PbSe, Se, Ag (146 sec) | Ag (p~3 × 10¹⁹ cm⁻³) BEP = 2.2 × 10⁻⁹ |
| Heat Ag Cell | | Se remains open | |
| p-type PbSe | PbSe (750 nm) | PbSe, Se, Ag (5,475 sec) | Ag (p~2.4 × 10¹⁸ cm⁻³) BEP = 3.7 × 10⁻¹⁰ |
| n-type PbSe | PbSe (750 nm) | PbSe, Se, Bi₂Se₃ (5,475 sec) | Bi₂Se₃ (n~3 × 10¹⁸ cm⁻³) BEP = 9 × 10⁻¹⁰ |
| Cool Bi₂Se₃ and Ag cells | | Se remains open | |
| n+ PbSe | PbSe (20 nm) | PbSe, Se, Bi₂Se₃ (146 sec) | Bi₂Se₃ (n~3 × 10¹⁹ cm⁻³) BEP = 1 × 10⁻⁸ |
| p+ PbSe | PbSe (20 nm) | PbSe, Se, Ag (146 sec) | Ag (p~3 × 10¹⁹ cm⁻³) BEP = 2.2 × 10⁻⁹ |
| Heat Bi₂Se₃ and Ag cells | | Se remains open | |
| p-type PbSrSe | Pb₀.₉₇Sr₀.₀₃Se (300 nm) | PbSe, Sr, Se, Ag (2,190 sec) | Ag (p~2.4 × 10¹⁸ cm⁻³) BEP = 3.7 × 10⁻¹⁰, Sr (3.5%) BEP = 9 × 10⁻⁹ |
| n-type PbSrSe | Pb₀.₉₇Sr₀.₀₃Se (300 nm) | PbSe, Sr, Se, Bi₂Se₃ (2,190 sec) | Sr (3.5%) BEP = 9 × 10⁻⁹, Bi₂Se₃ (n~3 × 10¹⁸ cm⁻³) BEP = 9 × 10⁻¹⁰ |
| Cool Bi₂Se₃ cell | | Se remains open | |
| n+ Barrier | Pb₀.₉₃Sr₀.₀₇Se (200 nm) | PbSe, Sr, Se, Bi₂Se₃ (1,460 sec) | Sr (7%) BEP = 1.8 × 10⁻⁸, Bi₂Se₃ (n~3 × 10¹⁹ cm⁻³) |
| n+ Contact | PbSe (20 nm) | PbSe, Se, Bi₂Se₃ (146 sec) | BEP = 1 × 10⁻⁸ |
| Cool CAR to 350° C. | | Se remains open | |
| REACTION | BaSe (<10 nm) | Se (300 sec) | Convert BaF₂ surface to BaSe |
| RELEASE | BaF₂ (30 nm) | BaF₂ (480 sec) | |
| Heat CAR to 550° C. | | Se remains closed | |
| Measure PbSe, Sr, Se, Bi₂Se₃, Ag, & BaF₂ Fluxes Growth Interrupt—Wafer Parked in Buffer Chamber | | | |
| Buffer* | CaF₂ (4 nm) Oxide Desorption Si (111) | CaF₂ (120 sec) | CAR 800° C. CAR to ~1050° C. |

*Previously grown M223a

With reference to the bottom of Table 5 and moving upwards, a three (3) inch (76 mm) diameter silicon growth substrate 38 having a (111) orientation is heated to a CAR assembly temperature of about 850° C. Next, a calcium fluoride layer of approximately 2.0 nm to 4.0 nm is deposited on top of the silicon growth substrate at a CAR temperature of 800° C. Growth for 60 to 120 seconds with a CaF$_2$ BEP of 1.2×10$^{-7}$ Torr will produce the desired thickness.

The CAR is then cooled to approximately 550° C. while the Se source shutter remains closed. A release layer 36 of barium fluoride is deposited for approximately 480 seconds for a target thickness of about 30 nm. The surface of the release layer is reacted with Se for approximately 300 seconds to convert the barium fluoride surface to approximately less than 10 nm (<10 nm) of BaSe. The CAR is cooled to approximately 350° C. for growth of the IV-VI semiconductor TPV device material.

An n+-type contact layer of PbSe that is doped with Bi$_2$Se$_3$ with a dopant concentration of about 3×10$^{19}$ cm$^{-3}$ having a BEP of 1×10$^{-8}$ Torr for an effusion cell temperature of about 942° C. for approximately 146 seconds for a target thickness of about 20 nm. The n+-type contact layer helps to reduce the contact resistance between the semiconductor and metallic materials used during module packaging. An approximately 200 nm thick n+-type barrier layer in the form of Pb$_{0.93}$Sr$_{0.07}$Se that is also doped with Bi$_2$Se$_3$ with the same dopant concentration and BEP is deposited during growth of the n+-type-contact layer. A growth time with the indicated BEPs of approximately 1,460 seconds produces a layer that is approximately 200 nm thick. Once the Bi$_2$Se$_3$ effusion cell cools, the growth of an approximately 300 nm of n-type layer 14 of the n-type side of the first junction of the two-junction IV-VI semiconductor structure 11 follows. The first n-type side of the first junction of the two-junction IV-VI semiconductor structure is doped with Bi$_2$Se$_3$ to produce an electron concentration of about 3×10$^{19}$ cm$^{-3}$. A Bi$_2$Se$_3$ BEP of about 9×10$^{-10}$ Torr produced by an effusion cell held at or about 850° C. will achieve this electron density.

Next, the p-type layer 16 is epitaxially grown. A silver doped p-type Pb$_{0.97}$Sr$_{0.03}$Se layer 300 nm thick is then grown with a Ag BEP of about 3.7×10$^{-10}$ Torr to produce a hole density of about 2.4×10$^{18}$ cm$^{-3}$.

The Ag effusion cell is heated from about 889° C. to about 1069° C. to produce a BEP of about 2.2×10$^{-9}$ Torr for growth of an approximately 20 nm thick p+-type PbSe side of tunnel junction 18 followed by an approximately 20 nm thick n+-type PbSe side of tunnel junction 8 having the dopant, BEP, and hole density indicated in Table 5.

The fabrication continues with the cooling of Ag effusion cell and growth of the n-type layer 14 of the n-type side of the second junction of the two junction IV-VI semiconductor structure. An approximately 750 nm thick n-type side of the second junction of the two-junction IV-VI semiconductor structure in the form of PbSe is doped with Bi$_2$Se$_3$ to produce an electron concentration of about 3×10$^{19}$ cm$^{-3}$ with a Bi$_2$Se$_3$ BEP of about 9×10$^{-10}$ Torr to achieve the described electron density. Next the p-type side of the second junction of the two-junction IV-VI semiconductor structure in the form of PbSe is doped with Ag to produce an hole concentration of about 2.4×10$^{18}$ cm$^{-3}$ with a Ag BEP of about 3.7×10$^{-10}$ Torr to achieve the described hole density.

The Ag effusion cell is then heated to produce a BEP of about 2.2×10$^{-9}$ Torr for growth of an approximately 20 nm thick p+-type PbSe contact layer similar to what was done in Example 1. The hole density in the p+-type PbSe contact layer is in the range of about 3×10$^{19}$ cm$^{-3}$.

Example 3—Fabrication of a Three-Junction IV-VI Structure

Example 3 illustrates a stacked three-junction IV-VI semiconductor structure composed of a first and second junction having the formulation of Pb$_{1-x}$Sr$_x$Se with the second junction having a decreased concentration of strontium, and a third junction having the formulation of PbSe. The structure includes two tunnel junctions both in the form of PbSe. One tunnel junction is positioned between the first and second junction and the other tunnel junction is between the second and third junction. For example, the stacked three-junction IV-VI semiconductor structure of Example 3 is configured to absorb infrared light in the range of about 4.2 microns to about 1.0 microns. The efficiency of the TPV cell is improved with three junctions because of the smaller quantum defect when using materials with different bandgap energies. The fabrication process of Example 3 is similar to the fabrication process described in Examples 1 and 2 with the differences including, but not limited to, the concentrations of the constituent components and the layer thicknesses as shown in the applicable table.

TABLE 6

| M224 | | | |
|---|---|---|---|
| Layers (target thicknesses) | | Open Shutters (time) | Alloying, Doping, etc. |
| p+ Contact | PbSe (20 nm) | PbSe, Se, Ag (146 sec) | Ag (p~3 × 10$^{19}$ cm$^{-3}$) BEP = 2.2 × 10$^{-9}$ |
| Heat Ag Cell | | Se remains open | |
| p-type PbSe | PbSe (750 nm) | PbSe, Se, Ag (5,475 sec) | Ag (p~2.4 × 10$^{18}$ cm$^{-3}$) BEP = 3.7 × 10$^{-10}$ |
| n-type PbSe | PbSe (750 nm) | PbSe, Se, Bi$_2$Se$_3$ (5,475 sec) | Bi$_2$Se$_3$(n~3 × 10$^{18}$ cm$^{-3}$) BEP= 9 × 10$^{-10}$ |
| Cool Bi$_2$Se$_3$ and Ag cells | | Se remains open | |
| n+ PbSe | PbSe (20 nm) | PbSe, Se, Bi$_2$Se$_3$ (146 sec) | Bi$_2$Se$_3$ (n~3 × 10$^{19}$ cm$^{-3}$) BEP = 1 × 10$^{-8}$ |
| p+ PbSe | PbSe (20 nm) | PbSe, Se, Ag (146 sec) | Ag (p~3 × 10 cm$^{-3}$) BEP = 2.2 × 10$^{-9}$ |
| Heat Bi$_2$Se$_3$ and Ag cells | | Se remains open | |
| p-type PbSrSe | Pb$_{0.97}$Sr$_{0.03}$Se (300 nm) | PbSe, Sr, Se, Ag (2,190 sec) | Ag (p~2.4 × 10$^{18}$ cm$^{-3}$) BEP = 3.7 × 10$^{-10}$, Sr (3.5%) BEP = 9 × 10$^{-9}$ |
| n-type PbSrSe | Pb$_{0.97}$Sr$_{0.03}$Se (300 nm) | PbSe, Sr, Se, Bi$_2$Se$_3$ (2,190 sec) | Sr (3.5%) BEP = 9 × 10$^{-9}$ Bi$_2$Se$_3$ (n~3 × 10$^{18}$ cm$^{-3}$) BEP = 9 × 10$^{-10}$ |
| Cool Bi$_2$Se$_3$ and Ag cells | | Se remains open | |
| n+ PbSe | PbSe (20 nm) | PbSe, Se, Bi$_2$Se$_3$ (146 sec) | Bi$_2$Se$_3$ (n~3 × 10$^{19}$ cm$^{-3}$) BEP = 1 × 10$^{-8}$ |
| p+ PbSe | PbSe (20 nm) | PbSe, Se, Ag (146 sec) | Ag (p~3 × 10$^{19}$ cm$^{-3}$) BEP = 2.2 × 10$^{-9}$ |
| Heat Bi$_2$Se$_3$ and Ag cells | | Se remains open | |
| p-type PbSrSe | Pb$_{0.93}$Sr$_{0.07}$Se (300 nm) | PbSe, Sr, Se, Ag (2,190 sec) | Ag (p~2.4 × 10$^{18}$ cm$^{-3}$) BEP = 3.7 × 10$^{-10}$, Sr (7%) BEP = 1.8 × 10$^{-8}$ |
| n-type PbSrSe | Pb$_{0.93}$Sr$_{0.07}$Se (300 nm) | PbSe, Sr, Se, Bi$_2$Se$_3$ (2,190 sec ) | Sr (7%) BEP = 1.8 × 10$^{-8}$ Bi$_2$Se$_3$ (n~3 × 10$^{18}$ cm$^{-3}$) BEP = 9 × 10$^{-10}$ |
| Cool Bi$_2$Se$_3$ cell | | Se remains open | |
| n+ Barrier | Pb$_{0.86}$Sr$_{0.14}$Se (200 nm) | PbSe, Sr, Se, Bi$_2$Se$_3$ (1,460 sec) | Sr (14%) BEP = 3.6 × 10$^{-8}$, Bi$_2$Se$_3$ (n~3 × 10$^{19}$ cm$^{-3}$) BEP = 1 × 10$^{-8}$ |
| n+ Contact | PbSe (20 nm) | PbSe, Se, Bi$_2$Se$_3$ (146 sec) | |
| Cool CAR to 350° C. | | Se remains open | |
| REACTION | BaSe (<10 nm) | Se (300 sec) | Convert BaF$_2$ surface to BaSe |
| RELEASE | BaF$_2$ (30 nm) | BaF$_2$ (480 sec) | |
| Heat CAR to 550° C. | | Se remains closed | |
| Measure PbSe, Sr, Se, Bi$_2$Se$_3$, Ag, & BaF$_2$ Fluxes | | | |
| Growth Interrupt—Wafer Parked in Buffer Chamber | | | |
| Buffer* | CaF$_2$ (4 nm) Oxide Desorption Si (111) | CaF$_2$ (120 sec) | CAR 800° C. CAR to ~1050° C. |

*Previously grown, M224a

With reference to the bottom of Table 6 and moving upwards, a three (3) inch (76 mm) diameter silicon growth substrate 38 having a (111) orientation is heated to a CAR assembly temperature of about 850° C. Next, a calcium fluoride layer of approximately 2.0 nm to 4.0 nm is deposited on top of the silicon growth substrate at a CAR temperature of 800° C. Growth for 60 to 120 seconds with a $CaF_2$ BEP of $1.2\times10^{-7}$ Torr will produce the desired thickness.

The CAR is then cooled to approximately 550° C. while the Se source shutter remains closed. A release layer 36 of barium fluoride is deposited for approximately 480 seconds for a target thickness of about 30 nm. The surface of the release layer is reacted with Se for approximately 300 seconds to convert the barium fluoride surface to approximately less than 10 nm (<10 nm) of BaSe. The CAR is cooled to approximately 350° C. for growth of the IV-VI semiconductor TPV device material.

An n+-type contact layer of PbSe that is doped with $Bi_2Se_3$ with a dopant concentration of about $3\times10^{19}$ $cm^{-3}$ having a BEP of $1\times10^{-8}$ Torr for an effusion cell temperature of about 942° C. for approximately 146 seconds for a target thickness of about 20 nm. The n+-type contact layer helps to reduce the contact resistance between the semiconductor and metallic materials used during module packaging. An approximately 200 nm thick n+-type barrier layer in the form of $Pb_{0.86}Sr_{0.14}Se$ that is also doped with $Bi_2Se_3$ with the same dopant concentration and BEP is deposited during growth of the n+-type-contact layer. A growth time with the indicated BEPs of approximately 1,460 seconds produces a layer that is approximately 200 nm thick. Once the $Bi_2Se_3$ effusion cell cools, the growth of an approximately 300 nm of n-type layer 14 of the n-type side of the first junction of the three-junction IV-VI semiconductor structure 11 follows. The first n-type side of the first junction of the three-junction IV-VI semiconductor structure in the form of $Pb_{0.93}Sr_{0.07}Se$ with a target thickness of about 300 nm is doped with $Bi_2Se_3$ to produce an electron concentration of about $3\times10^{19}$ $cm^{-3}$. A $Bi_2Se_3$ BEP of about $9\times10^{-10}$ Torr produced by an effusion cell held at or about 850° C. will achieve this electron density.

Next, the p-type layer 16 is epitaxially grown. A silver doped p-type $Pb_{0.97}Sr_{0.03}Se$ layer 300 nm thick is then grown with a Ag BEP of about $3.7\times10^{-10}$ Torr to produce a hole density of about $2.4\times10^{18}$ $cm^{-3}$.

The Ag effusion cell is heated from about 889° C. to about 1069° C. to produce a BEP of about $2.2\times10^{-9}$ Torr for growth of an approximately 20 nm thick p+-type PbSe side of the first tunnel junction 18 followed by an approximately 20 nm thick n+-type PbSe side of tunnel junction 18 having the dopant, BEP, and hole density indicated in Table 6.

The fabrication continues with the cooling of Ag effusion cell and continues with the n-type layer 14 of the n-type side of the second junction of the three junction IV-VI semiconductor structure. An approximately 300 nm thick n-type side of the second junction of the three-junction IV-VI semiconductor structure in the form of $Pb_{0.97}Sr_{0.03}Se$ is doped with $Bi_2Se_3$ to produce an electron concentration of about $3\times10^{19}$ $cm^{-3}$ with a $Bi_2Se_3$ BEP of about $9\times10^{-10}$ Torr to achieve the described electron density. Next the p-type side of the second junction of the three-junction IV-VI semiconductor structure in the form of $Pb_{0.97}Sr_{0.03}Se$ is doped with Ag to produce an hole concentration of about $2.4\times10^{18}$ $cm^{-3}$ with a Ag BEP of about $3.7\times10^{-10}$ Torr to achieve the described hole density.

The Ag effusion cell is then heated to produce a BEP of about $2.2\times10^{-9}$ Torr for growth of the second tunnel junction 18. The growth and property of the second tunnel junction is the same as the first as shown in Table 6 and thus will not be repeated.

The fabrication process continues to the third junction of the three junction IV-VI semiconductor structure and the p+-type PbSe contact layer as shown in Table 6. The fabrication process and the properties of the third-junction of the three-junction IV-VI and the p+-type PbSe contact layer is the same as previously described with reference to Example 2 and Table 5.

Example 4—Fabrication of a Four-Junction IV-VI Structure

Example 4 illustrates a stacked four-junction IV-VI semiconductor structure composed of a first, second, and third junction each having the formulation of $Pb_{1-x}Sr_xSe$ with the second and third junctions having a decreased concentration of strontium. The fourth junction has the formulation of PbSe. The structure includes three tunnel junctions all in the form of PbSe between each pair of adjacent junctions. For example, the stacked four-junction IV-VI semiconductor structure of Example 4 is configured to absorb infrared light in the range of about 4.2 microns to about 1.0 microns. The efficiency of the TPV cell is improved with four junctions because of the smaller quantum defect when using materials with different bandgap energies.

TABLE 7

M225

| Layers (target thicknesses) | | Open Shutters (time) | Alloying, Doping, etc. |
|---|---|---|---|
| p+ Contact | PbSe (20 nm) | PbSe, Se, Ag (146 sec) | Ag (p~$3\times10^{19}$ $cm^{-3}$) BEP = $2.2\times10^{-9}$ |
| Heat Ag Cell | | Se remains open | |
| p-type PbSe | PbSe (750 nm) | PbSe, Se, Ag (5,475 sec) | Ag (p~$2.4\times10^{18}$ $cm^{-3}$) BEP = $3.7\times10^{-10}$ |
| n-type PbSe | PbSe (750 nm) | PbSe, Se, $Bi_2Se_3$ (5,475 sec) | $Bi_2Se_3$ (n~$3\times10^{18}$ $cm^{-3}$) BEP = $9\times10^{-10}$ |
| Cool $Bi_2Se_3$ and Ag cells | | Se remains open | |
| n+ PbSe | PbSe (20 nm) | PbSe, Se, $Bi_2Se_3$ (146 sec) | $Bi_2Se_3$ (n~$3\times10^{19}$ $cm^{-3}$) BEP = $1\times10^{-8}$ |
| p+ PbSe | PbSe (20 nm) | PbSe, Se, Ag (146 sec) | Ag (p~$3\times10^{19}$ $cm^{-3}$) BEP = $2.2\times10^{-9}$ |
| Heat $Bi_2Se_3$ and Ag cells | | Se remains open | |
| p-type PbSrSe | $Pb_{0.97}Sr_{0.03}Se$ (300 nm) | PbSe, Sr, Se, Ag (2,190 sec) | Ag (p~$2.4\times10^{18}$ $cm^{-3}$) BEP = $3.7\times10^{-10}$, Sr (3.5%) BEP = $9\times10^{-9}$ |
| n-type PbSrSe | $Pb_{0.97}Sr_{0.03}Se$ (300 nm) | PbSe, Sr, Se, $Bi_2Se_3$ (2,190 sec) | Sr (3.5%) BEP = $9\times10^{-9}$, $Bi_2Se_3$ (n~$3\times10^{18}$ $cm^{-3}$) BEP = $9\times10^{-10}$ |
| Cool $Bi_2Se_3$ and Ag cells | | Se remains open | |
| n+ PbSe | PbSe (20 nm) | PbSe, Se, $Bi_2Se_3$ (146 sec) | $Bi_2Se_3$ (n~$3\times10^{19}$ $cm^{-3}$) BEP = $1\times10^{-8}$ |
| p+ PbSe | PbSe (20 nm) | PbSe, Se, Ag (146 sec) | Ag (p~$3\times10^{19}$ $cm^{-3}$) BEP = $2.2\times10^{-9}$ |
| Heat $Bi_2Se_3$ and Ag cells | | Se remains open | |
| p-type PbSrSe | $Pb_{0.93}Sr_{0.07}Se$ (300 nm) | PbSe, Sr, Se, Ag (2,190 sec) | Ag (p~$2.4\times10^{18}$ $cm^{-3}$) BEP = $3.7\times10^{-10}$, Sr (7%) BEP = $1.8\times10^{-8}$ |
| n-type PbSrSe | $Pb_{0.93}Sr_{0.07}Se$ (300 nm) | PbSe, Sr, Se, $Bi_2Se_3$ (2,190 sec) | Sr (7%) BEP = $1.8\times10^{-8}$, $Bi_2Se_3$ (n~$3\times10^{18}$ $cm^{-3}$) BEP = $9\times10^{-10}$ |
| Cool $Bi_2Se_3$ and Ag cells | | Se remains open | Cool $Bi_2Se_3$ and Ag cells |
| n+ PbSe | PbSe (20 nm) | PbSe, Se, $Bi_2Se_3$ (146 sec) | $Bi_2Se_3$ (n~$3\times10^{19}$ $cm^{-3}$) BEP = $1\times10^{-8}$ |
| p+ PbSe | PbSe (20 nm) | PbSe, Se, Ag (146 sec) | Ag (p~$3\times10^{19}$ $cm^{-3}$) BEP = $2.2\times10^{-9}$ |

TABLE 7-continued

M225

| Layers (target thicknesses) | | Open Shutters (time) | Alloying, Doping, etc. |
|---|---|---|---|
| Heat Bi$_2$Se$_3$ and Ag cells | | Se remains open | Heat Bi$_2$Se$_3$ and Ag cells |
| P-Type PbSrSe | Pb$_{0.86}$Sr$_{0.14}$Se (300 nm) | PbSe, Sr, Se, Ag (2,190 sec) | Ag (p~2.4 × 10$^{18}$ cm$^{-3}$) BEP = 3.7 × 10$^{-10}$, Sr (14%) BEP = 3.6 × 10$^{-8}$ |
| n-type PbSrSe | Pb$_{0.86}$Sr$_{0.14}$Se (300 nm) | PbSe, Sr, Se, Bi$_2$Se$_3$ (2,190 sec) | Sr (14%) BEP = 3.6 × 10$^{-8}$, Bi$_2$Se$_3$ (n~3 × 10$^{18}$ cm$^{-3}$) BEP = 9 × 10$^{-10}$ |
| Cool Bi$_2$Se$_3$ cell | | Se remains open | |
| n+ Barrier | Pb$_{0.79}$Sr$_{0.21}$Se (200 nm) | PbSe, Sr, Se, Bi$_2$Se$_3$ (1,460 sec) | Sr (21%) BEP = 5.4 × 10$^{-8}$, Bi$_2$Se$_3$ (n~3 × 10$^{19}$ cm$^{-3}$) BER = 1 × 10$^{-8}$ |
| n+ Contact | PbSe (20 nm) | PbSe, Se, Bi$_2$Se$_3$ (146 sec) | |
| Cool CAR to 350° C. | | Se remains open | |
| REACTION | BaSe (<10 nm) | Se (300 sec) | Convert BaF$_2$ surface to BaSe |
| RELEASE | BaF$_2$ (30 nm) | BaF$_2$ (480 sec) | |
| Heat CAR to 550° C. | | Se remains closed | |
| Measure PbSe, Sr, Se, Bi$_2$Se$_3$, Ag, & BaF$_2$ Fluxes Growth Interrupt—Wafer Parked in Buffer Chamber | | | |
| Buffer* | CaF$_2$ (4 nm) Oxide Desorption Si (111) | CaF$_2$ (120 sec) | CAR 800° C. CAR to ~1050° C. |

*Previously grown, M225a

The fabrication process of Example 4 is the same as the fabrication processes described in Examples 1-3, with the exceptions being the number of junctions 12 and tunnel junctions 18, the varying concentrations of the constituent components for each portion of the structure and the target thicknesses as indicated in Table 7. Accordingly, for brevity, the fabrication steps for Example 4 will not be repeated here.

Other alternatives, modifications, and variations of the above-described IV-VI semiconductor structures, TPV devices, and energy conversion systems, and methods of fabricating the same will be apparent to one skilled in the art. As such, the foregoing description merely enables and describes the general uses and methods of the present described structures, devices, systems, and methods of fabrication. Accordingly, it is intended to embrace all such alternatives, modifications and variations that fall within the spirit and broad scope of the presently disclosed inventive concepts, including, but not limited to, the appended claims.

What is claimed is:

1. A multi-junction thermophotovoltaic (TPV) device comprising:
   a Pb$_{1-x}$Sr$_x$Se semiconductor structure formed from at least two junctions, said at least two junctions including:
      a first junction comprising Pb$_{0.935}$Sr$_{0.065}$Se,
      a second junction proximate to said first junction, said second junction comprising Pb$_{0.965}$Sr$_{0.035}$Se, wherein each of said first and second junctions is a pn junction having an n-type layer overlying a p-type layer, and
      a tunnel junction between said first and second junctions and electrically connecting said first and second junctions in series, wherein said tunnel junction is a degenerately doped pn junction having a p$^+$ layer adjacent to said p-type layer of said first junction and said p$^+$ layer of said tunnel junction overlies an n$^+$ layer of said tunnel junction, and wherein said n$^+$ layer is adjacent to said n-type layer of said second junction; and
   at least one connector proximate to said Pb$_{1-x}$Sr$_x$Se semiconductor structure and configured to operably couple said multi-junction TPV device with a load, wherein said Pb$_{1-x}$Sr$_x$Se semiconductor structure is disposed on a host substrate comprising copper and is bonded thereto via a metallized bonding layer, the Pb$_{1-x}$Sr$_x$Se semiconductor structure further comprising a passivation layer with at least one metal contact that passes through the passivation layer, wherein 0.0≤x<0.3.

2. The multi-junction TPV device of claim 1, wherein said first junction is configured to be an anti-reflective coating of said second junction.

3. The multi-junction TPV device of claim 1, wherein said first junction has a thickness such that a photocurrent of said first junction is substantially matched to a photocurrent of said second junction.

4. The multi-junction TPV device of claim 1, wherein said first junction has a thickness that is at least an integer multiple of one-fourth times the quotient of a free-space wavelength of said first junction divided by a refractive index of said first junction.

5. The multi-junction TPV device of claim 1, wherein said p$^+$ layer of said tunnel junction has a dopant concentration greater than 1×10$^{19}$ cm$^{-3}$.

6. The multi-junction TPV device of claim 1, wherein said n$^+$ layer of said tunnel junction has a dopant concentration greater than 1×10$^{19}$ cm$^{-3}$.

7. The multi-junction TPV device of claim 1, wherein said p$^+$ layer and said n$^+$ layer of said tunnel junction each have a dopant concentration greater than 1×10$^{19}$ cm$^{-3}$.

* * * * *